US012761296B2

(12) United States Patent
Takahashi et al.

(10) Patent No.: US 12,761,296 B2
(45) Date of Patent: Oct. 13, 2026

(54) MAGNETIC SENSOR

(71) Applicant: TDK CORPORATION, Tokyo (JP)

(72) Inventors: Hirokazu Takahashi, Tokyo (JP); Kenzo Makino, Tokyo (JP)

(73) Assignee: TDK CORPORATION, Tokyo (JP)

( * ) Notice: Subject to any disclaimer, the term of this patent is extended or adjusted under 35 U.S.C. 154(b) by 131 days.

(21) Appl. No.: 18/968,123

(22) Filed: Dec. 4, 2024

(65) Prior Publication Data

US 2025/0093434 A1 Mar. 20, 2025

Related U.S. Application Data

(63) Continuation of application No. 18/517,863, filed on Nov. 22, 2023, now Pat. No. 12,189,003, which is a continuation of application No. 17/569,097, filed on Jan. 5, 2022, now Pat. No. 11,860,251.

(30) Foreign Application Priority Data

Jan. 18, 2021 (JP) ................................ 2021-005794

(51) Int. Cl.
*G01R 33/09* (2006.01)

(52) U.S. Cl.
CPC ......... *G01R 33/098* (2013.01); *G01R 33/093* (2013.01)

(58) Field of Classification Search
CPC ............................ G01R 33/098; G01R 33/093
See application file for complete search history.

(56) References Cited

U.S. PATENT DOCUMENTS

| | | | |
|---|---|---|---|
| 5,668,473 | A | 9/1997 | Van Den Berg |
| 5,783,284 | A | 7/1998 | Shinjo et al. |
| 6,373,242 | B1 | 4/2002 | Wappling |
| 11,860,251 | B2 | 1/2024 | Takahashi et al. |
| 2008/0169807 | A1 | 7/2008 | Naito et al. |
| 2009/0147567 | A1 | 6/2009 | Chen |
| 2021/0156933 | A1 | 5/2021 | Makino et al. |

FOREIGN PATENT DOCUMENTS

| | | | |
|---|---|---|---|
| DE | 42 43 357 | A1 | 6/1994 |
| DE | 197 40 408 | A1 | 3/1998 |
| DE | 102020130454 | A1 | 5/2021 |
| JP | H08-139388 | A | 5/1996 |
| JP | 2000-215413 | A | 8/2000 |
| JP | 2005-227134 | A | 8/2005 |

OTHER PUBLICATIONS

Sep. 20, 2022 Office Action translation issued in German Patent Application No. 102021006484.4.
Nov. 29, 2022 Office Action issued in Japanese Patent Application No. 2021-005794.
Jun. 28, 2024 Office Action issued in U.S. Appl. No. 18/517,863.

*Primary Examiner* — Alesa Allgood
(74) *Attorney, Agent, or Firm* — Oliff PLC

(57) ABSTRACT

A magnetic sensor includes an MR element. The MR element includes a free layer. The free layer has a first surface having a shape that is long in one direction and a second surface located opposite the first surface, and has a thickness that is a dimension in a direction perpendicular to the first surface. The first surface has a first edge and a second edge located at both lateral ends of the first surface. In a given cross section, the thickness at the first edge is smaller than the thickness at a predetermined point on the first surface between the first edge and the second edge.

26 Claims, 16 Drawing Sheets

MAGNETIC SENSOR

CROSS REFERENCE TO RELATED APPLICATIONS

This application is a continuation of U.S. Ser. No. 18/517,863 filed on Nov. 22, 2023, which is a continuation of U.S. Ser. No. 17/569,097 filed on Jan. 5, 2022, which claims the benefit of priority to Japanese Priority Patent Application No. 2021-005794 filed on Jan. 18, 2021. The contents of these applications are incorporated herein by reference in their entirety.

BACKGROUND

The technology relates to a magnetic sensor including a magnetoresistive element.

Magnetic sensors using magnetoresistive elements have been used for various applications in recent years. Known magnetoresistive elements include anisotropic magnetoresistive elements and spin-valve magnetoresistive elements. An anisotropic magnetoresistive element includes a magnetic layer that is given magnetic anisotropy and has a magnetization whose direction is variable depending on the direction of an applied magnetic field. A spin-valve magnetoresistive element includes a first magnetic layer (magnetization pinned layer) having a magnetization whose direction is fixed, a second magnetic layer (free layer) having a magnetization whose direction is variable depending on the direction of an applied magnetic field, and a spacer layer located between the first and second magnetic layers. The second magnetic layer (free layer) of the spin-valve magnetoresistive element can also sometimes be given magnetic anisotropy.

Magnetic anisotropy is often controlled by using magnetic shape anisotropy. Magnetic shape anisotropy can be set by patterning the magnetoresistive element to a shape that is long in one direction.

A system including a magnetic sensor may be intended to detect a magnetic field containing a component in a direction perpendicular to the surface of a substrate by using a magnetoresistive element provided on the substrate. In such a case, the magnetic field containing the component in the direction perpendicular to the surface of the substrate can be detected by providing a soft magnetic body for converting a magnetic field in the direction perpendicular to the surface of the substrate into a magnetic field in the direction parallel to the surface of the substrate or locating the magnetoresistive element on an inclined surface formed on the substrate.

US 2008/0169807 A1 discloses first and second magnetic sensors each including an X-axis sensor, a Y-axis sensor, and a Z-axis sensor disposed on a substrate. The first magnetic sensor has V-shaped grooves in a thick film located on its substrate. Band-like portions of giant magnetoresistive elements constituting the Z-axis sensor are disposed at locations having favorable flatness in the centers of the inclined surfaces of the grooves. The band-like portions are portions constituting the main bodies of the giant magnetoresistive elements and have a long slender band-like planar shape.

The second magnetic sensor has V-shaped grooves each having a first inclined surface and a second inclined surface in thick films located on its substrate. The second inclined surface constitutes a lower half of the inclined surface of the groove. An angle that the second inclined surface forms with the substrate is greater than an angle that the first inclined surface forms with the substrate. Band-like portions of giant magnetoresistive elements constituting the Z-axis sensor are disposed at locations having favorable flatness in the centers of the second inclined surfaces. The band-like portions have a long slender band-like planar shape.

If an external magnetic field is applied to a magnetoresistive element, the direction of the magnetic moment in the magnetic layer, having a magnetization whose direction is variable, rotates depending on the direction and strength of the external magnetic field. As a result, the direction of the magnetization of the magnetic layer rotates. In such a case, a demagnetizing field in a direction opposite to that of the external magnetic field occurs in the magnetic layer due to magnetic charges occurring at the edges of the magnetic layer. The strength of the demagnetizing field is higher as it is closer to the magnetic charges. The strength of the demagnetizing field is thus high at the edges of the magnetic layer. The strength of the demagnetizing field is low in the midsection of the magnetic layer.

Now, suppose that a magnetic layer given magnetic anisotropy by using magnetic shape anisotropy is subjected to an external magnetic field in a predetermined direction intersecting the direction of the easy axis of magnetization. In such a case, the direction of the magnetic moment in the midsection of the magnetic layer changes differently with respect to at portions of the magnetic layer near the edges as follows. If no external magnetic field is applied, the direction of the magnetic moment is the same as the direction of the easy axis of magnetization. If the strength of the external magnetic field is low, the direction of the magnetic moment in the midsection of the magnetic layer starts to rotate based on the direction of the external magnetic field. However, the direction of the magnetic moment does not rotate or hardly rotates at the portions of the magnetic layer near the edges.

If the strength of the external magnetic field becomes high to a certain extent, the direction of the magnetic moment in the midsection of the magnetic layer becomes the same or substantially the same as the direction of the external magnetic field. Meanwhile, at portions of the magnetic layer near the edges, the direction of the magnetic moment starts to rotate based on the direction of the external magnetic field. If the strength of the external magnetic field becomes even higher, the direction of the magnetic moment at portions of the magnetic layer near the edges also becomes the same or substantially the same as the direction of the external magnetic field.

The reason why the direction of the magnetic moment does not change uniformly within the entire magnetic layer is that the strength of the demagnetizing field differs between the edges of the magnetic layer and the midsection of the magnetic layer. Since the direction of the magnetic moment does not change uniformly, the magnetization of the magnetic layer changes nonlinearly with respect to a change in the strength of the external magnetic field. As a result, a detection signal generated by the magnetic sensor changes nonlinearly with respect to a change in the strength of the external magnetic field. The nonlinearity of the detection signal appears more significantly as the strength of the external magnetic field increases. The narrower the range where the detection signal changes linearly, the narrower the range of the strength of the magnetic field actually detectable by the magnetic sensor and the narrower the range of the detection signal actually used.

In view of reducing errors and facilitating signal processing, a wide range of where the detection signal changes linearly is desirable. To reduce the nonlinearity due to differences in the strength of the demagnetizing fields and expand the range where the detection signal changes linearly, contrivances to prevent the concentration of magnetic charges at the edges of the magnetic layer are needed. However, such contrivances have not heretofore been given due consideration.

SUMMARY

Magnetic sensors according to first and second aspects of one embodiment of the technology are magnetic sensors including a magnetoresistive element whose resistance changes with an external magnetic field. The magnetoresistive element includes a magnetic layer having a magnetization whose direction is variable depending on the external magnetic field. The magnetic layer has a first surface having a shape that is long in one direction and a second surface located opposite the first surface, and has a thickness that is a dimension in a direction perpendicular to the first surface of the magnetic layer. The first surface has a first edge and a second edge located at both lateral ends of the first surface.

In the magnetic sensor according to the first aspect of one embodiment of the technology, in a given cross section intersecting the magnetic layer and perpendicular to a longitudinal direction of the first surface, the thickness at the first edge is smaller than the thickness at a predetermined point on the first surface between the first edge and the second edge.

In the magnetic sensor according to the first aspect of one embodiment of the technology, in the given cross section, the thickness at the second edge may be greater than the thickness at the predetermined point. In such a case, in the given cross section, the thickness may decrease toward the first edge from the second edge. Alternatively, in the given cross section, the thickness at the second edge may be smaller than the thickness at the predetermined point. In such a case, in the given cross section, the thickness may decrease toward the first edge from the predetermined point and decrease toward the second edge from the predetermined point.

In the magnetic sensor according to the second aspect of one embodiment of the technology, at least a part of the first surface is inclined relative to a reference plane so that an inclination angle is greater than 0, the inclination angle being an angle that the first surface forms with the reference plane. In a given cross section intersecting the magnetic layer and perpendicular to a longitudinal direction of the first surface, the inclination angle at the first edge is greater than the inclination angle at a predetermined point on the first surface between the first edge and the second edge.

In the magnetic sensor according to the second aspect of one embodiment of the technology, in the given cross section, the inclination angle at the second edge may be smaller than the inclination angle at the predetermined point. In such a case, in the given cross section, the inclination angle may increase toward the first edge from the second edge. Alternatively, in the given cross section, the inclination angle at the second edge may be greater than the inclination angle at the predetermined point. In such a case, in the given cross section, the inclination angle may increase toward the first edge from the predetermined point and increase toward the second edge from the predetermined point.

In the magnetic sensor according to the second aspect of one embodiment of the technology, the magnetic layer may have a thickness that is a dimension in a direction perpendicular to the first surface of the magnetic layer. The thickness may decrease as the inclination angle increases.

The magnetic sensors according to the first and second aspects of one embodiment of the technology may further include a support member that supports the magnetoresistive element. The support member has an opposed surface opposed to the magnetoresistive element. The opposed surface may be inclined at least in part relative to a/the reference plane. In such a case, the thickness at a given position on the first surface may decrease as an angle that the opposed surface forms with the reference plane at a position on the opposed surface closest to the given position increases. The opposed surface may include a curved portion not parallel to the reference plane. In such a case, at least a part of the magnetoresistive element may be located on the curved portion. At least either one of the first and second edges may be located above the curved portion.

A magnetic sensor according to a third aspect of one embodiment of the technology is a magnetic sensor including a magnetoresistive element whose resistance changes with an external magnetic field, and a support member that supports the magnetoresistive element. The magnetoresistive element includes a magnetic layer having a magnetization whose direction is variable depending on the external magnetic field. The magnetic layer has a first surface having a shape that is long in one direction and a second surface located opposite the first surface. The first surface has a first edge and a second edge located at both lateral ends of the first surface.

The support member has an opposed surface opposed to the magnetoresistive element. At least a part of the opposed surface is inclined relative to a reference plane. An angle that the opposed surface forms with the reference plane in a given cross section intersecting the magnetic layer and perpendicular to a longitudinal direction of the first surface is greater at a first position that is a position on the opposed surface closest to the first edge than at a position on the opposed surface closest to a predetermined point on the first surface between the first edge and the second edge.

In the magnetic sensor according to the third aspect of one embodiment of the technology, the angle at a second position that is a position on the opposed surface closest to the second edge may be smaller than the angle at the position on the opposed surface closest to the predetermined point. In such a case, the angle may increase toward the first position from the second position. Alternatively, the angle at the second position may be greater than the angle at the position on the opposed surface closest to the predetermined point. In such a case, the angle may increase toward the first position from the position on the opposed surface closest to the predetermined point and increase toward the second position from the position on the opposed surface closest to the predetermined point.

In the magnetic sensor according to the third aspect of one embodiment of the technology, the magnetic layer may have a thickness that is a dimension in a direction perpendicular to the opposed surface. In such a case, the thickness at a given position on the first surface may decrease as the angle at a position on the opposed surface closest to the given position increases.

In the magnetic sensor according to the third aspect of one embodiment of the technology, the opposed surface may include a curved portion not parallel to the reference plane. In such a case, at least a part of the magnetoresistive element may be located on the curved portion. At least either one of the first and second edges may be located above the curved portion.

In the magnetic sensor according to the first aspect of one embodiment of the technology, in the given cross section intersecting the magnetic layer and perpendicular to the longitudinal direction of the first surface, the thickness at the first edge is smaller than the thickness at the predetermined point on the first surface between the first edge and the second edge. According to one embodiment of the technology, the concentration of magnetic charges at the edges of the magnetic layer of the magnetoresistive element can thus be reduced to expand the range where a detection signal generated by the magnetic sensor changes linearly.

In the magnetic sensor according to the second aspect of one embodiment of the technology, in the given cross section intersecting the magnetic layer and perpendicular to the longitudinal direction of the first surface, the inclination angle at the first edge is greater than the inclination angle at the predetermined point on the first surface between the first edge and the second edge. According to one embodiment of the technology, the thickness at the first edge can thus be made smaller than the thickness at the predetermined point on the first surface between the first edge and the second edge. As a result, according to one embodiment of the technology, the concentration of magnetic charges at the edges of the magnetic layer of the magnetoresistive element can be reduced to expand the range where a detection signal generated by the magnetic sensor changes linearly.

In the magnetic sensor according to the third aspect of one embodiment of the technology, the angle that the opposed surface forms with the reference plane in the given cross section intersecting the magnetic layer and perpendicular to the longitudinal direction of the first surface is greater at the first position that is the position on the opposed surface closest to the first edge than at the position on the opposed surface closest to the predetermined point on the first surface between the first edge and the second edge. According to one embodiment of the technology, the thickness at the first edge can thus be made smaller than the thickness at the predetermined point on the first surface between the first edge and the second edge. As a result, according to one embodiment of the technology, the concentration of magnetic charges at the edges of the magnetic layer of the magnetoresistive element can be reduced to expand the range where a detection signal generated by the magnetic sensor changes linearly.

Other and further objects, features and advantages of the technology will appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
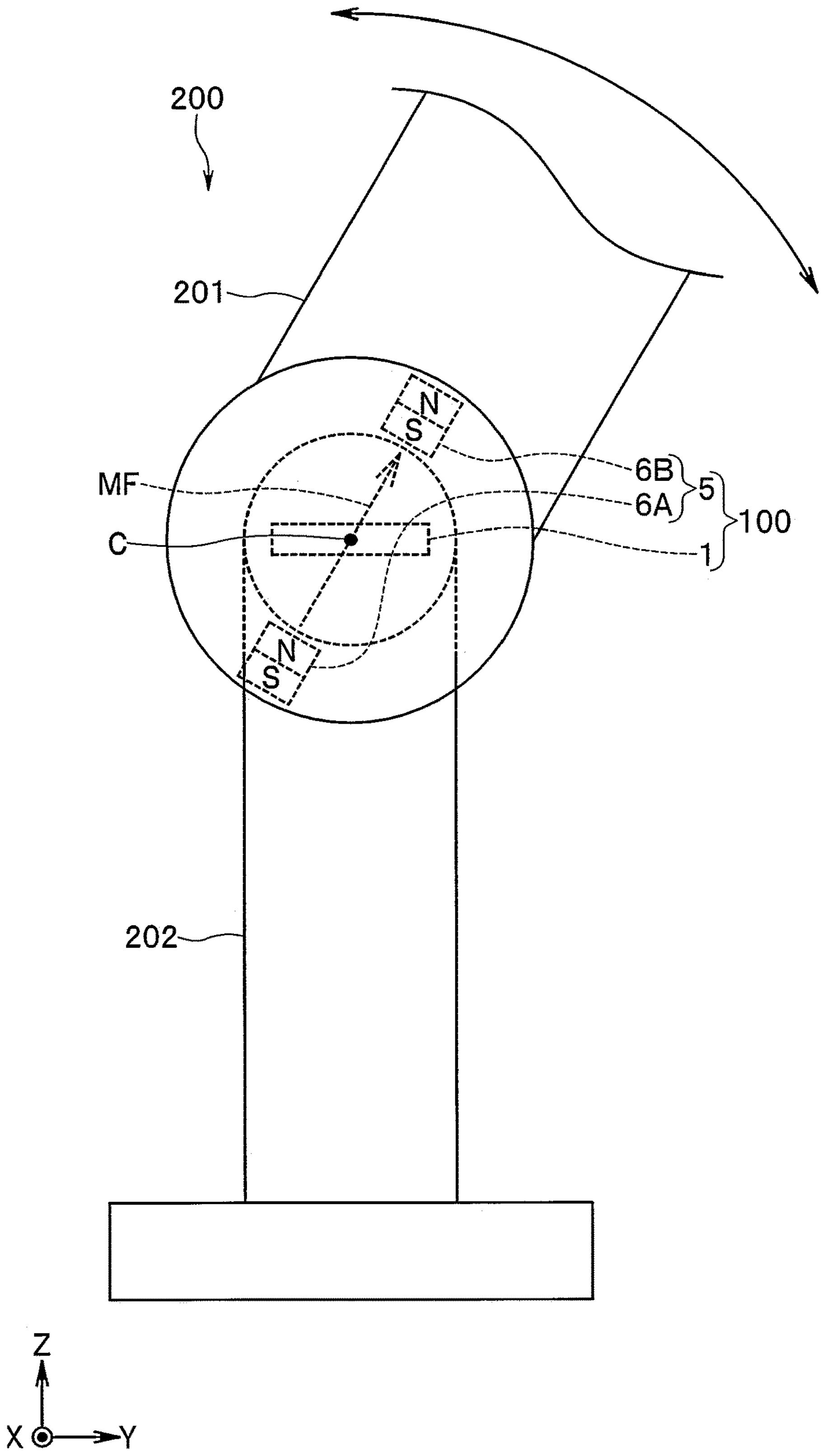
FIG. 1 is an explanatory diagram showing a schematic configuration of a magnetic sensor system of a first example embodiment of the technology.

An object of the technology is to provide a magnetic sensor that can reduce the concentration of magnetic charges at the edge of a magnetic layer of a magnetoresistive element to expand a range where a detection signal changes linearly.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

First Example Embodiment

Example embodiments of the technology will now be described in detail with reference to the drawings. An outline of a magnetic sensor system including a magnetic sensor according to a first example embodiment of the technology will initially be described with reference to FIG. 1. A magnetic sensor system 100 according to the present example embodiment includes a magnetic sensor 1 according to the present example embodiment and a magnetic field generator 5. The magnetic field generator 5 generates a target magnetic field MF that is a magnetic field for the magnetic sensor 1 to detect (magnetic field to be detected).

The magnetic field generator 5 is rotatable about a rotation axis C. The magnetic field generator 5 includes a pair of magnets 6A and 6B. The magnets 6A and 6B are arranged at symmetrical positions with a virtual plane including the rotation axis C at the center. The magnets 6A and 6B each have an N pole and an S pole. The magnets 6A and 6B are located in an orientation such that the N pole of the magnet 6A is opposed to the S pole of the magnet 6B. The magnetic field generator 5 generates the target magnetic field MF in the direction from the N pole of the magnet 6A to the S pole of the magnet 6B.

The magnetic sensor 1 is located at a position where the target magnetic field MF at a predetermined reference position can be detected. The target magnetic field MF at the reference position is part of the magnetic fields generated by the respective magnets 6A and 6B. The reference position may be located on the rotation axis C. In the following description, the reference position is located on the rotation axis C. The magnetic sensor 1 detects the target magnetic field MF generated by the magnetic field generator 5, and generates a detection value Vs. The detection value Vs has a correspondence with a relative position, or rotational position in particular, of the magnetic field generator 5 with respect to the magnetic sensor 1.

The magnetic sensor system 100 can be used as a device for detecting the rotational position of a rotatable moving part in an apparatus that includes the moving part. Examples of such an apparatus include a joint of an industrial robot. FIG. 1 shows an example where the magnetic sensor system 100 is applied to an industrial robot 200.

The industrial robot 200 shown in FIG. 1 includes a moving part 201 and a support unit 202 that rotatably supports the moving part 201. The moving part 201 and the support unit 202 are connected at a joint. The moving part 201 rotates about the rotation axis C. For example, if the magnetic sensor system 100 is applied to the joint of the industrial robot 200, the magnetic sensor 1 may be fixed to the support unit 202, and the magnets 6A and 6B may be fixed to the moving part 201.

Now, we define X, Y, and Z directions as shown in FIG. 1. The X, Y, and Z directions are orthogonal to one another. In the present example embodiment, a direction parallel to the rotation axis C (in FIG. 1, a direction out of the plane of the drawing) will be referred to as the X direction. In FIG. 1, the Y direction is shown as a rightward direction, and the Z direction is shown as an upward direction. The opposite directions to the X, Y, and Z directions will be referred to as −X, −Y, and −Z directions, respectively. As used herein, the term “above” refers to positions located forward of a reference position in the Z direction, and “below” refers to positions located on a side of the reference position opposite to “above”.

In the present example embodiment, the direction of the target magnetic field MF at the reference position is expressed as a direction within the YZ plane including the reference position on the rotation axis C. The direction of the target magnetic field MF at the reference position rotates about the reference position within the foregoing YZ plane.

The magnetic sensor 1 includes magnetoresistive elements (hereinafter, referred to as MR elements) whose resistances change with an external magnetic field. In the present example embodiment, the resistances of the MR elements change with a change in the direction of the target magnetic field MF. The magnetic sensor 1 generates detection signals corresponding to the resistances of the MR elements, and generates a detection value Vs based on the detection signals.

Next, a configuration of the magnetic sensor 1 according to the present example embodiment will be described. An example of a circuit configuration of the magnetic sensor 1 will initially be described with reference to FIG. 2. In the example shown in FIG. 2, the magnetic sensor 1 includes four resistor sections 11, 12, 13, and 14, two power supply nodes V1 and V2, two ground nodes G1 and G2, and two signal output nodes E1 and E2.

The resistor sections 11 to 14 each include at least one MR element 30. If each of the resistor sections 11 to 14 includes a plurality of MR elements 30, the plurality of MR elements 30 in each of the resistor sections 11 to 14 may be connected in series.

The resistor section 11 is provided between the power supply node V1 and the signal output node E1. The resistor section 12 is provided between the signal output node E1 and the ground node G1. The resistor section 13 is provided between the power supply node V2 and the signal output node E2. The resistor section 14 is provided between the signal output node E2 and the ground node G2. The power supply nodes V1 and V2 are configured to receive a power supply voltage of predetermined magnitude. The ground nodes G1 and G2 are connected to the ground.

The potential of the connection point between the resistor section 11 and the resistor section 12 changes depending on the resistance of the at least one MR element 30 of the resistor section 11 and the resistance of the at least one MR element 30 of the resistor section 12. The signal output node E1 outputs a signal corresponding to the potential of the connection point between the resistor section 11 and the resistor section 12 as a detection signal S1.

The potential of the connection point between the resistor section 13 and the resistor section 14 changes depending on the resistance of the at least one MR element 30 of the resistor section 13 and the resistance of the at least one MR element 30 of the resistor section 14. The signal output node E2 outputs a signal corresponding to the potential of the connection point between the resistor section 13 and the resistor section 14 as a detection signal S2.

The magnetic sensor 1 further includes a detection value generation circuit 21 that generates the detection value Vs on the basis of the detection signals S1 and S2. The detection value generation circuit 21 includes an application specific integrated circuit (ASIC) or a microcomputer, for example.

Figure 3:
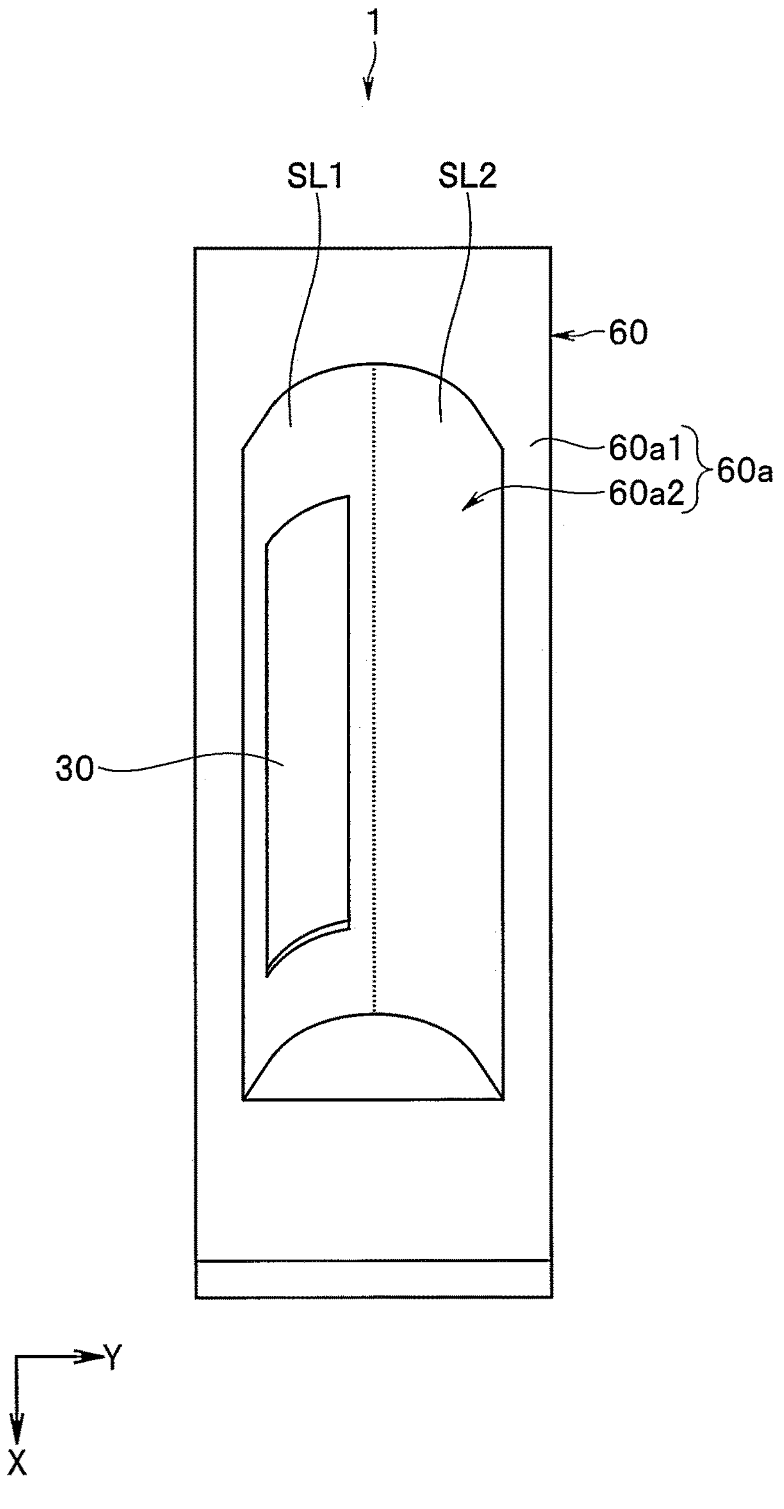
FIG. 3 is a schematic diagram showing a part of the magnetic sensor according to the first example embodiment of the technology.
Figure 4:
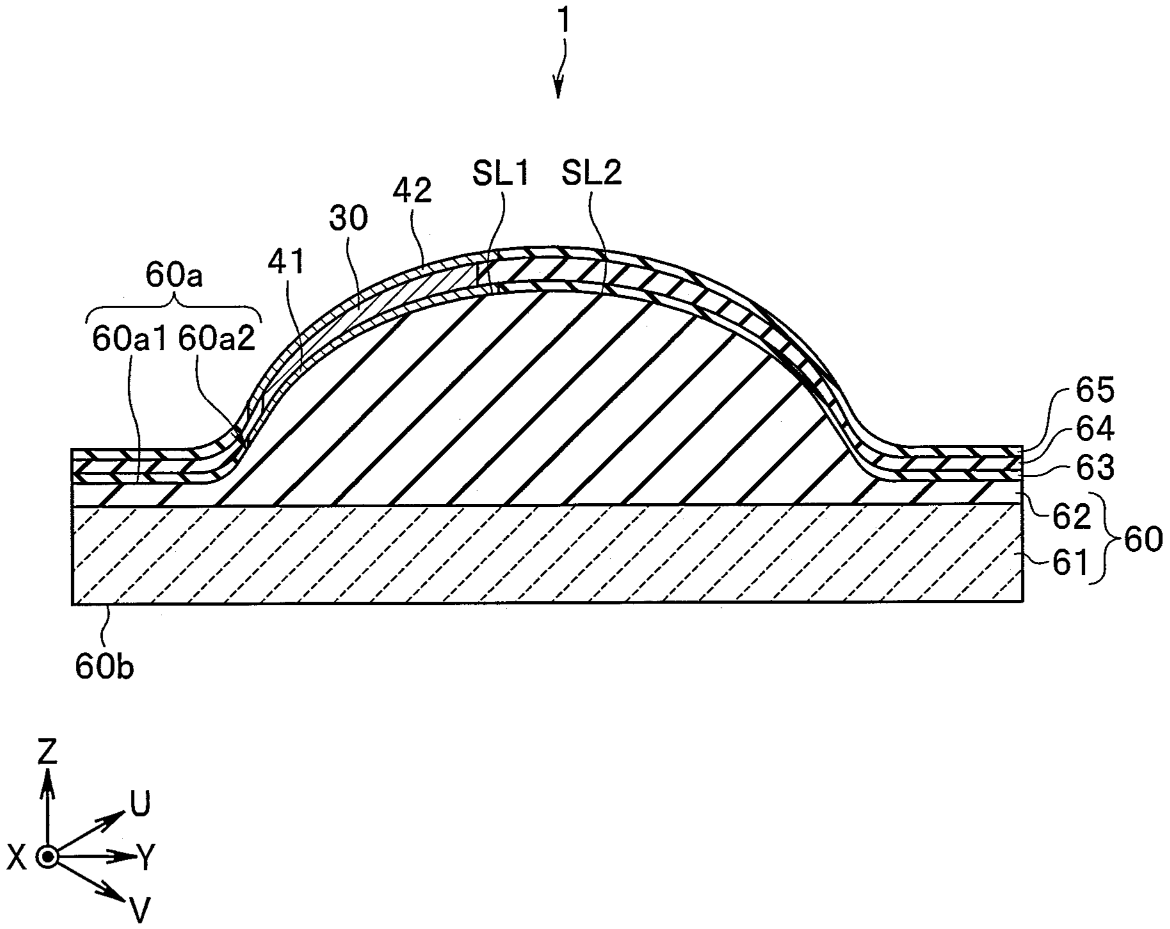
FIG. 4 is a sectional view showing a part of the magnetic sensor according to the first example embodiment of the technology.
Figure 5:
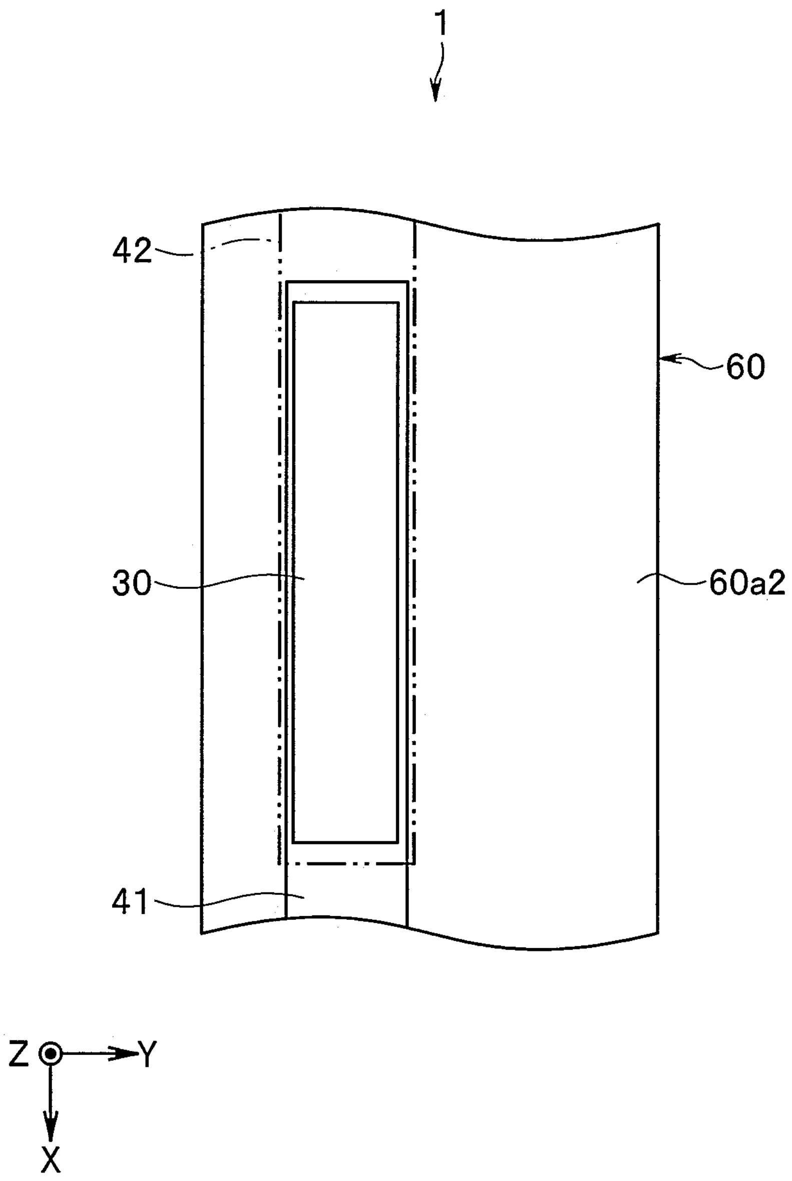
FIG. 5 is a plan view showing a part of the magnetic sensor according to the first example embodiment of the technology.

Next, the configuration of the magnetic sensor 1 will be described in more detail with attention focused on one MR element 30. FIG. 3 is a schematic diagram showing a part of the magnetic sensor 1. FIG. 4 is a cross-sectional view showing a part of the magnetic sensor 1. FIG. 4 shows a cross section parallel to the YZ plane and intersecting the MR element 30. FIG. 5 is a plan view showing a part of the magnetic sensor 1.

The magnetic sensor 1 further includes a support member 60. The support member 60 supports all the MR elements 30 included in the resistor sections 11 to 14. As shown in FIGS. 3 and 4, the support member 60 includes an opposed surface 60*a* opposed, at least in part, to the MR elements 30, and a bottom surface 60*b* located opposite the opposed surface 60*a*. The opposed surface 60*a* is located at an end of the support member 60 in the Z direction. The bottom surface 60*b* is located at an end of the support member 60 in the −Z direction. The bottom surface 60*b* is parallel to the XY plane. The bottom surface 60*b* corresponds to the reference plane in the technology. For example, the magnetic sensor 1 may be manufactured with the bottom surface 60*b* or a surface corresponding to the bottom surface 60*b* made horizontal. For example, the magnetic sensor 1 may be installed based on the direction or tilt of the bottom surface 60*b* or the surface corresponding to the bottom surface 60*b*. The bottom surface 60*b* may thus serve as a reference plane in at least either the manufacturing or the installing of the magnetic sensor 1.

At least a part of the opposed surface 60*a* of the support member 60 is inclined relative to the reference plane, i.e., the bottom surface 60*b*. In the present example embodiment, the opposed surface 60*a* includes a flat portion 60*a*1 parallel to the bottom surface 60*b* and at least one curved portion 60*a*2 not parallel to the bottom surface 60*b*. As shown in FIG. 4, the curved portion 60*a*2 is a convex surface protruding in a direction away from the bottom surface 60*b*. The curved portion 60*a*2 has a curved shape (arch shape) curved to protrude in a direction away from the bottom surface 60*b* (Z direction) in a given cross section parallel to the YZ plane. In a given cross section parallel to the YZ plane, the distance from the bottom surface 60*b* to the curved portion 60*a*2 is maximized at the center of the curved portion 60*a*2 in a direction parallel to the Y direction (hereinafter, referred to simply as the center of the curved portion 60*a*2).

The curved portion 60*a*2 extends along the X direction. As shown in FIG. 3, the overall shape of the curved portion 60*a*2 is a semicylindrical curved surface formed by moving the curved shape (arch shape) shown in FIG. 4 along the X direction.

At least a part of the MR element 30 is located on the curved portion 60*a*2. A portion of the curved portion 60*a*2 from an edge at the end of the curved portion 60*a*2 in the −Y direction to the center of the curved portion 60*a*2 will be referred to as a first inclined surface and be denoted by the reference symbol SL1. A portion of the curved portion 60*a*2 from an edge at the end of the curved portion 60*a*2 in the Y direction to the center of the curved portion 60*a*2 will be referred to as a second inclined surface and be denoted by the reference symbol SL2. In FIG. 3, the border between the first inclined surface SL1 and the second inclined surface SL2 is shown by a dotted line. Both the first and second inclined surfaces SL1 and SL2 are inclined relative to the reference plane, i.e., the bottom surface 60*b*. In the present example embodiment, the entire MR element 30 is located on the first inclined surface SL1 or the second inclined surface SL2. FIGS. 3 and 4 show how the MR element 30 is located on the first inclined surface SL1.

The MR element 30 has a shape that is long in the X direction. As employed herein, the lateral direction of the MR element 30 will be referred to as the width direction of the MR element 30 or simply as the width direction. The MR element 30 may have a planar shape (shape seen in the Z direction), like a rectangle, including a constant width portion having a constant or substantially constant width in the width direction regardless of the position in the X direction. The MR element 30 may have a planar shape including no constant width portion, like an ellipse. Examples of the planar shape of the MR element 30 including a constant width portion include a rectangular shape where both longitudinal ends are straight, an oval shape where both longitudinal ends are semicircular, and a shape where both longitudinal ends are polygonal. FIG. 3 shows an example where the MR element 30 has a rectangular planar shape. In a second modification example to be described later, the MR element 30 will be described to have an oval planar shape. The MR element 30 has a width that is a dimension in the direction parallel to the Y direction. This dimension of the MR element 30 in the width direction is constant or substantially constant regardless of the position in the X direction.

The support member 60 includes a substrate 61 and an insulating layer 62 located on the substrate 61. The substrate 61 is a semiconductor substrate made of a semiconductor such as Si, for example. The substrate 61 has a top surface located at an end of the substrate 61 in the Z direction, and a bottom surface located at an end of the substrate 61 in the −Z direction. The bottom surface 60*b* of the support member 60 is constituted by the bottom surface of the substrate 61. The substrate 61 has a constant thickness (dimension in the Z direction).

The insulating layer 62 is made of an insulating material such as $SiO_2$, for example. The insulating layer 62 includes a top surface located at an end in the Z direction. The opposed surface 60*a* of the support member 60 is constituted by the top surface of the insulating layer 62. The insulating layer 62 has a cross-sectional shape such that the curved surface portion 60*a*2 is formed on the opposed surface 60*a*. Specifically, the insulating layer 62 has a cross-sectional shape of bulging out in the Z direction in a given cross section parallel to the YZ plane.

The magnetic sensor 1 further includes a lower electrode 41, an upper electrode 42, and insulating layers 63, 64 and 65. In FIG. 3, the lower electrode 41, the upper electrode 42, and the insulating layers 63 to 65 are omitted. In FIG. 5, the insulating layers 63 to 65 are omitted.

The lower electrode 41 is located on the opposed surface 60*a* of the support member 60 (the top surface of the insulating layer 62). The insulating layer 63 is located on the opposed surface 60*a* of the support member 60, around the lower electrode 41. The MR element 30 is located on the lower electrode 41. The insulating layer 64 is located on the lower electrode 41 and the insulating layer 63, around the MR element 30. The upper electrode 42 is located on the MR element 30 and the insulating layer 64. The insulating layer 65 is located on the insulating layer 64, around the upper electrode 42.

The magnetic sensor 1 further includes a non-shown insulating layer covering the upper electrode 42 and the insulating layer 65. The lower electrode 41 and the upper electrode 42 are made of a conductive material such as Cu, for example. The insulating layers 63 to 65 and the non-shown insulating layer are made of an insulating material such as $SiO_2$, for example.

The substrate 61 and the portions of the magnetic sensor 1 stacked on the substrate 61 are referred to collectively as a detection unit. FIG. 4 can be said to show the detection unit. The detection value generation circuit 21 shown in FIG. 2 may be integrated with or separate from the detection unit.

Figure 6:
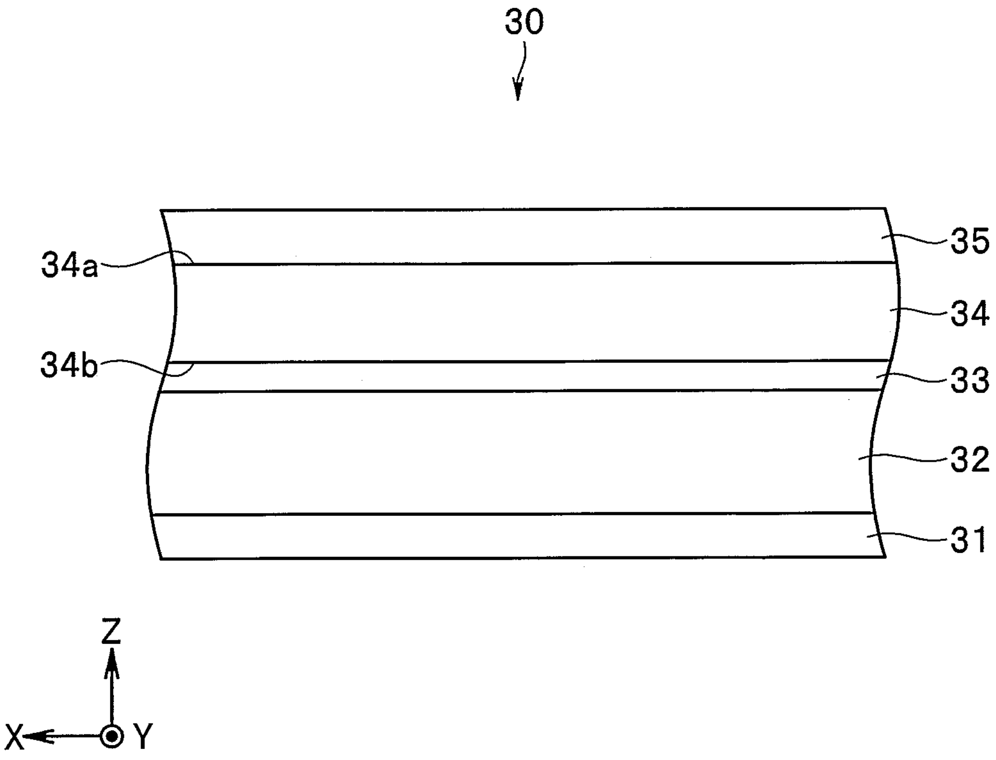
FIG. 6 is a sectional view showing a magnetoresistive element of the first example embodiment of the technology.

Now, the configuration of the MR element 30 will be described in detail with reference to FIG. 6. In particular, in the present example embodiment, the MR element 30 is a spin-valve MR element of current perpendicular-to-plane (CPP) structure. As shown in FIG. 6, the MR element 30 includes a magnetization pinned layer 32 having a magnetization whose direction is fixed, a free layer 34 having a magnetization whose direction is variable depending on the direction of an external magnetic field, and a spacer layer 33 located between the magnetization pinned layer 32 and the free layer 34. The MR element 30 may be a tunneling magnetoresistive (TMR) element or a giant magnetoresistive (GMR) element. In the TMR element, the spacer layer 33 is a tunnel barrier layer. In the GMR element, the spacer layer 33 is a nonmagnetic conductive layer. The resistance of the MR element 30 changes with an angle that the direction of the magnetization of the free layer 34 forms with respect to the direction of the magnetization of the magnetization pinned layer 32. The resistance is minimized if the angle is 0°. The resistance is maximized if the angle is 180°.

The magnetization pinned layer 32, the spacer layer 33, and the free layer 34 are stacked in this order from the lower electrode 41 in the direction toward the upper electrode 42. The MR element 30 further includes an underlayer 31 interposed between the magnetization pinned layer 32 and the lower electrode 41, and a cap layer 35 interposed between the free layer 34 and the upper electrode 42. The arrangement of the magnetization pinned layer 32, the spacer layer 33, and the free layer 34 in the MR element 30 may be vertically reversed from that shown in FIG. 6.

The direction of the magnetization of the magnetization pinned layer 32 is desirably orthogonal to the longitudinal direction of the MR element 30. In the present example embodiment, the MR element 30 is located on the first inclined surface SL1 or the second inclined surface SL2 inclined relative to the bottom surface 60*b*. The direction of the magnetization of the magnetization pinned layer 32 is thus also inclined relative to the bottom surface 60*b*.

For the sake of convenience, in the present example embodiment, the direction of the magnetization of the magnetization pinned layer 32 located on the first inclined surface SL1 will be referred to as a U direction or a −U direction. The U direction is a direction rotated from the Y direction toward the Z direction by a predetermined angle. The −U direction is the direction opposite to the U direction. For the sake of convenience, in the present example embodiment, the direction of the magnetization of the magnetization pinned layer 32 located on the second inclined surface SL2 will be referred to as a V direction or a −V direction. The V direction is a direction rotated from the Y direction toward the −Z direction by a predetermined angle. The −V direction is the direction opposite to the V direction.

Figure 2:
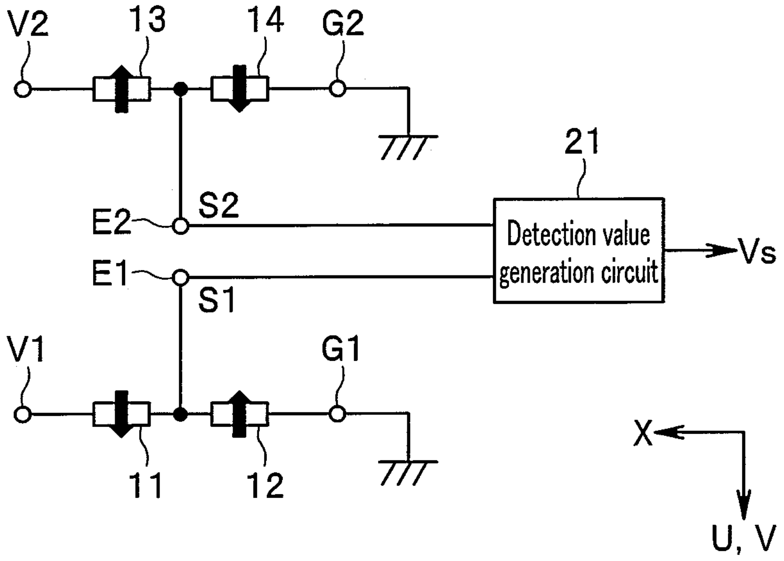
FIG. 2 is a circuit diagram showing the circuit configuration of a magnetic sensor according to the first example embodiment of the technology.

The X, U and V directions are shown in FIG. 2. For the sake of convenience, in FIG. 2, the U direction and the V direction are indicated by the same arrow. In FIG. 2, the filled arrows indicate the directions of the magnetizations of the magnetization pinned layers 32 of the MR elements 30 included in the respective resistor sections 11 to 14. The magnetic sensor 1 may be configured so that the directions of the magnetizations of the magnetization pinned layers 32 of the MR elements 30 in the resistor sections 11 and 14 are the U direction, and the directions of the magnetizations of the magnetization pinned layers 32 of the MR elements 30 in the resistor sections 12 and 13 are the −U direction. Alternatively, the magnetic sensor 1 may be configured so that the directions of the magnetizations of the magnetization pinned layers 32 of the MR elements 30 in the resistor sections 11 and 14 are the V direction, and the directions of the magnetizations of the magnetization pinned layers 32 of the MR elements 30 in the resistor sections 12 and 13 are the −V direction.

Alternatively, the magnetic sensor 1 may include a first circuit portion and a second circuit portion each including the resistor sections 11 to 14. The first circuit portion may be configured so that the directions of the magnetizations of the magnetization pinned layers 32 of the MR elements 30 in the resistor sections 11 and 14 are the U direction, and the directions of the magnetizations of the magnetization pinned layers 32 of the MR elements 30 in the resistor sections 12 and 13 are the −U direction. The second circuit portion may be configured so that the directions of the magnetizations of the magnetization pinned layers 32 of the MR elements 30 in the resistor sections 11 and 14 are the V direction, and the directions of the magnetizations of the magnetization pinned layers 32 of the MR elements 30 in the resistor sections 12 and 13 are the −V direction.

The free layer 34 corresponds to a magnetic layer according to the technology. The free layer 34 has magnetic shape anisotropy where the direction of the easy axis of magnetization intersects the direction of the magnetization of the magnetization pinned layer 32. In the present example embodiment, the MR element 30 is patterned to a shape that is long in the X direction. This gives the free layer 34 magnetic shape anisotropy where the direction of the easy axis of magnetization is parallel to the X direction.

Up to this point, the configuration of the magnetic sensor 1 has been described with attention focused on one MR element 30. In the present example embodiment, the resistor sections 11 to 14 each include at least one MR element 30. The magnetic sensor 1 thus includes a plurality of MR elements 30, a plurality of lower electrodes 41, and a plurality of upper electrodes 42. As shown in FIG. 5, each of the lower electrodes 41 has a long slender shape. The MR element 30 is provided on the top surface of the lower electrode 41, near one end in the longitudinal direction. Each upper electrode 42 has a long slender shape and is located over two lower electrodes 41 to electrically connect two adjoining MR elements 30.

The number of curved portions 60*a*2 of the opposed surface 60*a* of the support member 60 may be one or more than one. If the number of curved portions 60*a*2 is one, the plurality of MR elements 30 are located on the one curved portion 60*a*2. In such a case, the plurality of MR elements 30 may be located on either one of the first and second inclined surfaces SL1 and SL2 or on both the first and second inclined surfaces SL1 and SL2.

If the number of curved portions 60*a*2 is more than one, one or a plurality of MR elements 30 may be located on one curved portion 60*a*2. In such a case, the plurality of curved portions 60*a*2 may be arranged along one direction. Alternatively, the plurality of curved portions 60*a*2 may be arranged in a plurality of rows, i.e., more than one curved portion 60*a*2 in both the X and Y directions.

Figure 7:
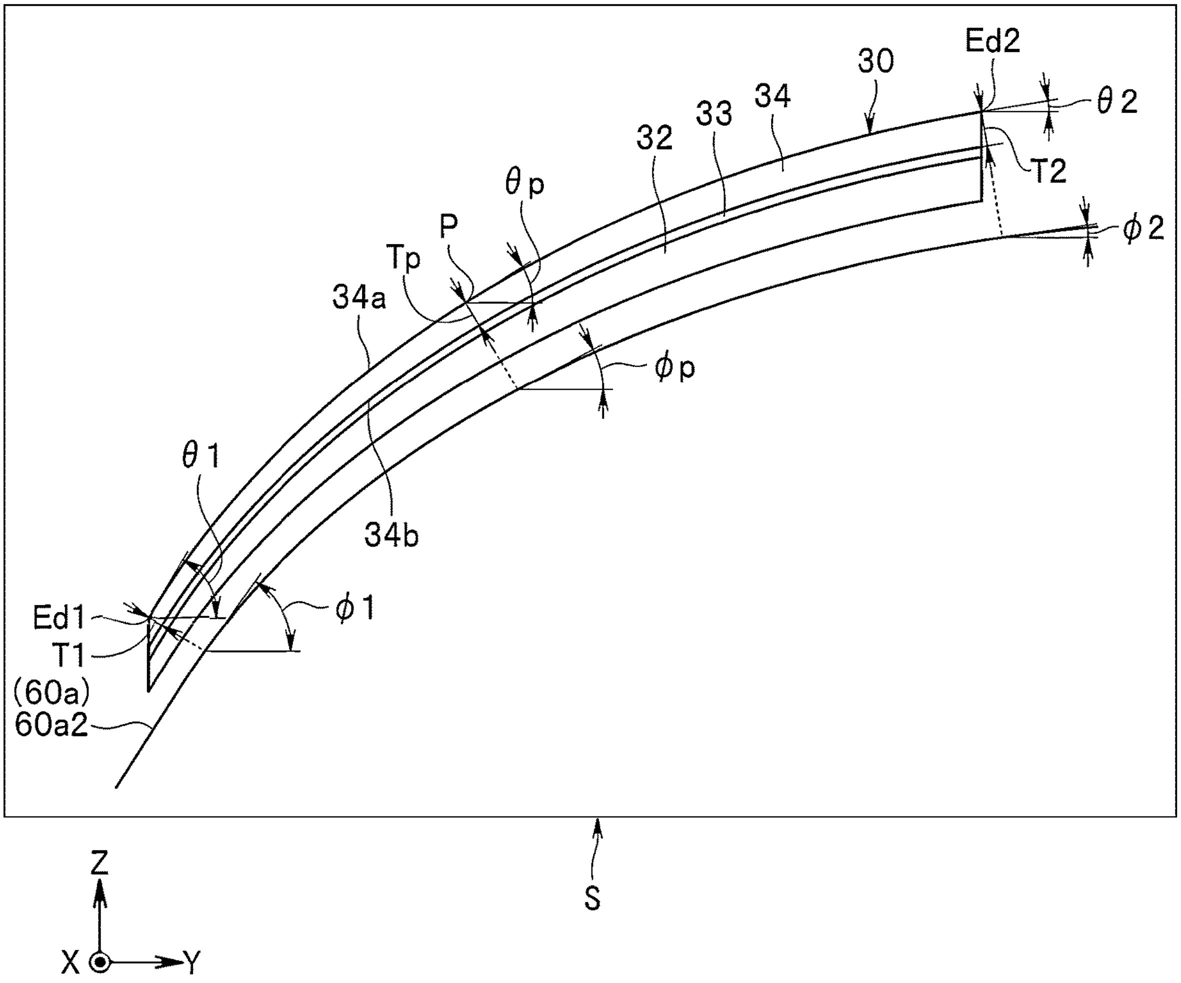
FIG. 7 is an explanatory diagram for describing a shape of a free layer of the first example embodiment of the technology.

Next, the MR element 30 will be described in more detail with reference to FIGS. 6 and 7. FIG. 7 is an explanatory diagram for describing the shape of the free layer 34. FIG. 7 is an enlarged view of a part of the cross section shown in FIG. 4. In FIG. 7, the underlayer 31 and the cap layer 35 of the MR element 30 are omitted.

As shown in FIGS. 6 and 7, the free layer 34 includes a first surface 34*a*, a second surface 34*b* opposite to the first surface 34*a*, and an outer peripheral surface connecting the first surface 34*a* and the second surface 34*b*. The first surface 34*a* is located farther from the opposed surface 60*a* of the support member 60 than is the second surface 34*b*. The first surface 34*a* is in contact with the cap layer 35. The second surface 34*b* is in contact with the spacer layer 33.

In the present example embodiment, the MR element 30 is patterned to a shape that is long in the X direction. The first and second surfaces 34*a* and 34*b* thus each have a shape that is long in the X direction. The first surface 34a has a first edge Ed1 and a second edge Ed2 located at both lateral ends of the first surface 34a. At least either one of the first and second edges Ed1 and Ed2 is located above the curved portion 60a2 of the opposed surface 60a of the support member 60. At least a part of the first surface 34a is thus inclined relative to the reference plane, i.e., the bottom surface 60b of the support member 60. As employed herein, an angle that the first surface 34a forms with the bottom surface 60b of the support member 60 will be referred to as an inclination angle and be denoted by the symbol θ. The inclination angle θ is 0° or greater and not greater than 90°. At least a part of the first surface 34a is inclined relative to the bottom surface 60b of the support member 60 so that the inclination angle θ is greater than 0°.

The shape of the free layer 34 can change discontinuously and greatly near the outer peripheral surface. To accurately define the inclination angle θ, in the present example embodiment, both lateral ends of the portion of the first surface 34a, not including discontinuously and greatly changing areas, will be referred to, for the sake of convenience, as the first and second edges Ed1 and Ed2. The first edge Ed1 and the second edge Ed2 may be located inside the first surface 34a, inside the border between the first surface 34a and the outer peripheral surface. If the shape of the free layer 34 does not change discontinuously, the first edge Ed1 and the second edge Ed2 fall on the border between the first surface 34a and the outer peripheral surface.

In the present example embodiment, both the first and second edges Ed1 and the Ed2 are located above the first inclined surface SL1 of the curved portion 60a2 or both the first and second edges Ed1 and Ed2 are located above the second inclined surface SL2 of the curved portion 60a2. The entire first surface 34a is thus inclined relative to the reference plane, i.e., the bottom surface 60b of the support member 60. The distance from the bottom surface 60b of the support member 60 to the first edge Ed1 is smaller than the distance from the bottom surface 60b of the support member 60 to the second edge Ed2.

FIG. 7 shows a cross section intersecting the free layer 34 and perpendicular to the longitudinal direction of the first surface 34a (direction parallel to the X direction). Such a cross section will hereinafter be denoted by the symbol S. The cross section S is also a cross section parallel to the YZ plane. The inclination angle θ at the first edge Ed1 will be referred to as an inclination angle θ1. The inclination angle θ at the second edge Ed2 will be referred to as an inclination angle θ2. The inclination angle θ at a predetermined point P on the first surface 34a between the first edge Ed1 and the second edge Ed2 will be denoted by the symbol θp.

In a given cross section S, the inclination angle θ1 at the first edge Ed1 is greater than the inclination angle θp at the predetermined point P. In the given cross section S, the inclination angle θ2 at the second edge Ed2 is smaller than the inclination angle θp. As shown in FIG. 7, in the given cross section S, the inclination angle θ increases toward the first edge Ed1 from the second edge Ed2. In FIG. 7, the predetermined point P refers to the midpoint between the first and second edges Ed1 and Ed2 on the first surface 34a in the given cross section S.

The inclination angle θ at a given position on the first surface 34a changes depending on the angle that the opposed surface 60a of the support member 60 forms with the reference plane, i.e., the bottom surface 60b of the support member 60 (hereinafter, referred to as the inclination angle of the opposed surface 60a). Specifically, the inclination angle θ at a given position on the first surface 34a is substantially the same as the inclination angle of the opposed surface 60a at the position on the opposed surface 60a closest to the given position. The inclination angle θ thus increases as the inclination angle of the opposed surface 60a increases.

The free layer 34 has a thickness T that is a dimension in a direction perpendicular to the first surface 34a. The thickness T can also be said to be the distance between the first and second surfaces 34a and 34b in the direction perpendicular to the first surface 34a. The thickness T at the first edge Ed1 will be referred to as a thickness T1. The thickness T at the second edge Ed2 will be referred to as a thickness T2. The thickness T at the predetermined point P will be referred to as a thickness Tp. For the sake of convenience, an imaginary surface is assumed by extending the second surface 34b along the curved portion 60a2, and the thickness T2 is defined as the distance between the first surface 34a and the imaginary surface in the direction perpendicular to the first surface 34a.

In a given cross section S, the thickness T1 at the first edge Ed1 is smaller than the thickness Tp at the predetermined point P. In the given cross section S, the thickness T2 at the second edge Ed2 is greater than the thickness Tp. As shown in FIG. 7, in the given cross section S, the thickness T decreases toward the first edge Ed1 from the second edge Ed2.

The thickness T at a given position on the first surface 34a changes depending on the inclination angle of the opposed surface 60a. Specifically, the thickness T at a given position on the first surface 34a decreases as the inclination angle of the opposed surface 60a at the position on the opposed surface 60a closest to the given position increases.

From the relationship between the inclination angle θ and the inclination angle of the opposed surface 60a and the relationship between the thickness T and the inclination angle of the opposed surface 60a, the thickness T decreases as the inclination angle θ increases.

In the present example embodiment, the entire MR element 30 is located on the first inclined surface SL1 or the second inclined surface SL2. The angle that the first inclined surface SL1 or the second inclined surface SL2 forms with the bottom surface 60b of the support member 60 will hereinafter be referred to as an inclined surface angle and be denoted by the symbol ϕ. As shown in FIG. 7, the inclination angle θ at a given position on the first surface 34a increases as the inclined surface angle ϕ at the position on the opposed surface 60a closest to the given position increases. As shown in FIG. 7, the thickness T at a given position on the first surface 34a decreases as the inclined surface angle ϕ at the position on the opposed surface 60a closest to the given position increases. In FIG. 7, the inclined surface angle ϕ at a position on the opposed surface 60a closest to the first edge Ed1 is denoted by the symbol ϕ1. The inclined surface angle ϕ at a position on the opposed surface 60a closest to the second edge Ed2 is denoted by the symbol ϕ2. The inclined surface angle ϕ at a position on the opposed surface 60a closest to the predetermined point P is denoted by the symbol ϕp.

The angle ϕ in a given cross section S is greater at the position on the opposed surface 60a closest to the first edge Ed1 than at the position on the opposed surface 60a closest to the predetermined point P. In other words, the angle ϕ1 is greater than the angle ϕp. The angle ϕ2 is smaller than the angle ϕp. As shown in FIG. 7, the angle ϕ in the given cross section S increases toward the position on the opposed surface 60a closest to the first edge Ed1 from the position on the opposed surface 60a closest to the second edge Ed2.

Examples of the thickness T and the inclined surface angle ϕ will now be described. The following description will be given by using a case where a TMR element was formed as an MR element 30 of a practical example on the first inclined surface SL1, as an example. In this example, the TMR element was formed by using a magnetron sputtering apparatus, and the thickness T of the free layer 34 of the MR element 30 (TMR element) was measured under a cross-sectional transmission electron microscope (cross-sectional TEM). In the MR element 30 (TMR element) of the practical example, the distance from the first edge Ed1 to the second edge Ed2 in a cross section parallel to the YZ plane was 1.3 μm.

In the practical example, the thickness T1 at the first edge Ed1 was 9.0 nm. The inclined surface angle ϕ1 at the position on the opposed surface 60*a* closest to the first edge Ed1 was 39.1°.

In the practical example, the thickness T2 at the second edge Ed2 was 10.9 nm. The inclined surface angle ϕ2 at the position on the opposed surface 60*a* closest to the second edge Ed2 was 25.2°.

In actually fabricating the MR element 30, the first surface 34*a* of the free layer 34 can have so high a surface roughness that effects on various parameters are not negligible. In such a case, to reduce measurement errors, inclination angles θ including the inclination angles θ1, θ2, and θp may be measured in the following manner. Initially, determine average lines (straight lines) of the cross-sectional curve of the first surface 34*a* near the respective measurement points of the inclination angles θ. Then, measure the angles that the average lines form with the bottom surface 60*b* of the support member 60 as the inclination angles θ at the measurement points by assuming the average lines as the tangents to the first surface 34*a* at the measurement points. The average lines desirably have such a length that the average lines intersect the cross-sectional curve a plurality of times. For example, in the case of the MR element 30 (TMR element) according to the practical example, the average lines may have a length in the range of 10 to 100 nm. Such an angle measurement method may be employed as the specific definition of the inclination angles θ in the present example embodiment.

To reduce measurement errors, the thicknesses T at the measurement points may be measured by assuming the directions perpendicular to the foregoing average lines as the directions perpendicular to the first surface 34*a*. Alternatively, if the opposed surface 60*a* including the curved portion 60*a*2 has a lower surface roughness than that of the first surface 34*a*, the thicknesses T at the measurement points may be measured by assuming the directions perpendicular to the opposed surface 60*a* at the positions on the opposed surface 60*a* closest to the measurement points as the directions perpendicular to the first surface 34*a*. Either one of the foregoing methods for measuring the thickness T may be employed as the specific definition of the thickness T in the present example embodiment.

Next, operation and effects of the magnetic sensor 1 according to the present example embodiment will be described. In the present example embodiment, in a given cross section S, the thickness T1 at the first edge Ed1 is smaller than the thickness Tp at the predetermined point P. Moreover, in the present example embodiment, the thickness T2 at the second edge Ed2 is greater than the thickness Tp in the given cross section S. According to the present example embodiment, the concentration of magnetic charges at and near the first edge Ed1 of the free layer 34 can thus be reduced.

In the present example embodiment, in a given cross section S, the inclination angle θ1 at the first edge Ed1 is greater than the inclination angle θp at the predetermined point P. Moreover, in the given cross section S, the inclination angle θ2 at the second edge Ed2 is smaller than the inclination angle θp at the predetermined point P. The inclination angle θ is substantially the same as the inclination angle of the opposed surface 60*a*, and can be controlled by changing the position of the MR element 30 and/or the inclination angle itself of the opposed surface 60*a*.

As described above, the thickness T decreases as the inclination angle of the opposed surface 60*a* increases. Such a relationship between the thickness T and the inclination angle of the opposed surface 60*a* can be achieved by forming the MR element 30 using a so-called non-conformal film formation apparatus such as a magnetron sputtering apparatus. The inclination angles θ can be controlled by the inclination angle of the opposed surface 60*a* and the arrangement of the MR element 30. According to the present example embodiment, the thickness T can be controlled by controlling the inclination angles θ as described above.

Figure 8:
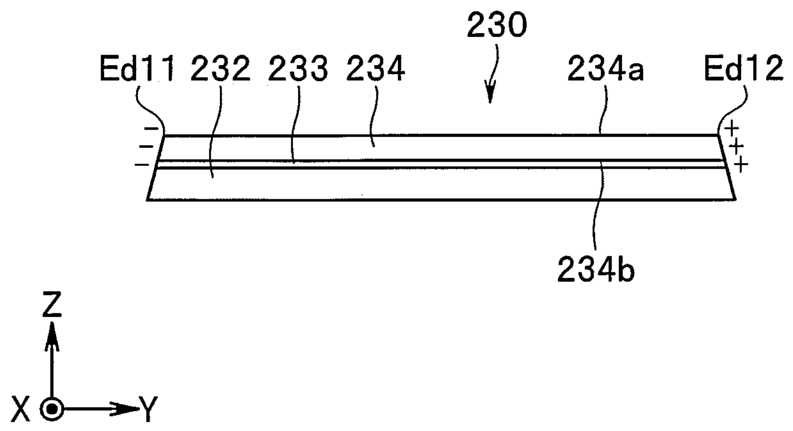
FIG. 8 RELATED ART
FIG. 8 is an explanatory diagram for describing magnetic charges on a magnetoresistive element according to a comparative example.

The effect of reducing the concentration of magnetic charges will be described in detail below by comparison with an MR element 230 according to a comparative example. The MR element 230 of the comparative example will initially be described with reference to FIG. 8. FIG. 8 is an explanatory diagram for describing magnetic charges on the MR element 230 of the comparative example. FIG. 8 shows a cross section corresponding to the cross section S. Like the MR element 30 according to the present example embodiment, the MR element 230 according to the comparative example includes a magnetization pinned layer 232, a spacer layer 233, a free layer 234, and a not-shown underlayer and cap layer.

The MR element 230 of the comparative example is located on a flat surface parallel to the reference plane (bottom surface 60*b* of the support member 60). Like the MR element 30 according to the present example embodiment, the MR element 230 is patterned to a shape that is long in the X direction. This gives the free layer 234 magnetic shape anisotropy where the direction of the easy axis of magnetization is parallel to the X direction.

The free layer 234 includes a first surface 234*a* located at an end in the Z direction, a second surface 234*b* opposite to the first surface 234*a*, and an outer peripheral surface connecting the first surface 234*a* and the second surface 234*b*. Both the first and second surfaces 234*a* and 234*b* are flat surfaces parallel to the reference plane. The first and second surfaces 234*a* and 234*b* each have a shape that is long in the X direction. The first surface 234*a* has a first edge Ed11 and a second edge Ed12 located at both ends in the lateral direction of the first surface 234*a*, i.e., a direction parallel to the Y direction. In particular, in the comparative example, the first edge Ed11 is an edge located at the end of the first surface 234*a* in the −Y direction. The second edge Ed12 is an edge located at the end of the first surface 234*a* in the Y direction.

If an external magnetic field is applied to the MR element 230, the direction of the magnetic moment inside the free layer 234 rotates depending on the direction and strength of the external magnetic field. As a result, the direction of the magnetization of the free layer 234 rotates. Here, magnetic charges occur on the outer peripheral surface of the free layer 234.

Now, suppose that an external magnetic field in the Y direction is applied to the MR element 230. If the external magnetic field in the Y direction is applied, positive magnetic charges concentrate at a portion of the outer peripheral surface of the free layer 234 near the second edge Ed12, and negative magnetic charges concentrate at a portion of the outer peripheral surface of the free layer 234 near the first edge Ed11. In FIG. 8, the symbols "+" represent positive magnetic charges, and the symbols "−" negative magnetic charges. A demagnetizing field in the −Y direction occurs in the free layer 234 due to such magnetic charges. The strength of the demagnetizing field is higher as it is closer to the magnetic charges. The strength of the demagnetizing field in the portions of the free layer 234 near the first and second edges Ed11 and Ed12 is therefore high. The strength of the demagnetizing field in the midsection of the free layer 234 is low.

If no external magnetic field is applied, the direction of the magnetization of the free layer 234 and the direction of the magnetic moment in the free layer 234 are parallel to the X direction. If the strength of the external magnetic field is low, the direction of the magnetic moment in the midsection of the free layer 234 starts to rotate toward the Y direction. On the other hand, the direction of the magnetic moment in the portions of the free layer 234 near the first and second edges Ed11 and Ed12 does not rotate or hardly rotates.

If the strength of the external magnetic field becomes high to a certain extent, the direction of the magnetic moment in the midsection of the free layer 234 becomes the same or substantially the same as the Y direction. Meanwhile, the direction of the magnetic moment in the portions of the free layer 234 near the first and second edges Ed11 and Ed12 starts to rotate toward the Y direction. If the strength of the external magnetic field becomes even higher, the direction of the magnetic moment in the portions of the free layer 234 near the first and second edges Ed11 and Ed12 also becomes the same or substantially the same as the Y direction.

As described above, in the MR element 230 of the comparative example, the direction of the magnetic moment in the entire free layer 234 does not change uniformly because of the demagnetizing field. As a result, the magnetization of the free layer 234 changes nonlinearly with respect to a change in the strength of the external magnetic field. Consequently, a detection signal generated by a magnetic sensor including the MR element 230 of the comparative example changes nonlinearly with respect to a change in the strength of the external magnetic field.

Figure 9:
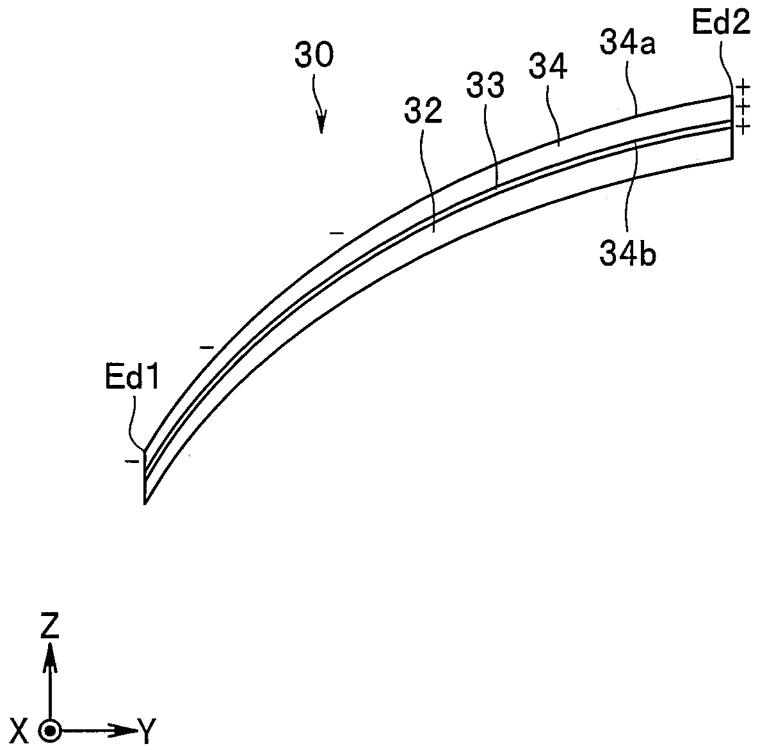
FIG. 9 is an explanatory diagram for describing magnetic charges on the magnetoresistive element of the first example embodiment of the technology.

Next, magnetic charges on the MR element 30 according to the present example embodiment will be described. FIG. 9 is an explanatory diagram for describing magnetic charges on the MR element 30. FIG. 9 shows a cross section corresponding to the cross section S. In FIG. 9, the symbols "+" represent positive magnetic charges, and the symbols "−" negative magnetic charges.

In the MR element 30 according to the present example embodiment, the thickness T1 at the first edge Ed1 is smaller than the thickness T2 at the second edge Ed2. Now, suppose that an external magnetic field in the Y direction is applied to the MR element 30. In such a case, positive magnetic charges concentrate at a portion of the outer peripheral surface of the free layer 34 near the second edge Ed2 as in the comparative example. By contrast, negative magnetic charges do not concentrate at a portion of the outer peripheral surface of the free layer 34 near the first edge Ed1 but are distributed even over the first surface 34*a*. This reduces a difference between the strength of the demagnetizing field at the portion of the free layer 34 near the first edge Ed1 and that of the demagnetizing field in the midsection of the free layer 34. As the difference decreases, the direction of the magnetic moment at the portion of the free layer 34 near the first edge Ed1 rotates more similarly to that of the magnetic moment in the midsection of the free layer 34. According to the present example embodiment, the magnetization of the free layer 34 can thus be prevented from changing nonlinearly with respect to a change in the strength of the external magnetic field. As a result, according to the present example embodiment, the range where the detection signal generated by the magnetic sensor 1 change linearly can be expanded.

Next, a result of an experiment for examining the linearity of the detection signal will be described. For the experiment, a magnetic sensor of the practical example and a magnetic sensor of the comparative example were fabricated. The magnetic sensor of the practical example and the magnetic sensor of the comparative example each have basically the same configuration as that of the magnetic sensor 1 according to the present example embodiment. The magnetic sensor of the practical example includes MR elements 30 (TMR elements) according to the foregoing practical example as the MR elements 30. The magnetic sensor of the comparative example includes MR elements 230 according to the comparative example instead of the MR elements 30. The MR elements 230 according to the comparative example are TMR elements formed on a flat surface parallel to the reference plane (bottom surface 60*b* of the support member 60) by the same method as with the MR elements 30 according to the practical example.

In the experiment, changes in a detection signal (signal corresponding to the detection signal S1 or S2) generated by each of the magnetic sensors of the practical example and the comparative example were examined while changing the strength of the external magnetic field in the Y direction applied to the magnetic sensors.

Figure 10:
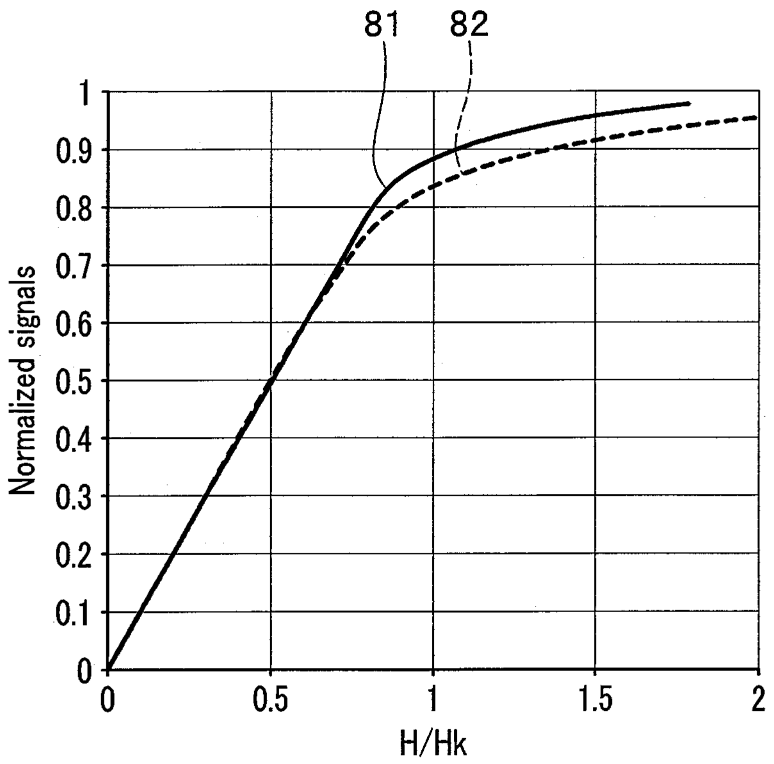
FIG. 10 is a characteristic chart showing a relationship between an external magnetic field and a detection signal of the first example embodiment of the technology.

FIG. 10 shows the results of the experiment. Here, the strength of the external magnetic field applied to the magnetic sensors is expressed by H, and the strength of the magnetic anisotropy fields in the free layers 34 and 234 is expressed by Hk. The horizontal axis of FIG. 10 indicates H/Hk. The vertical axis of FIG. 10 indicates normalized signals obtained by normalizing the detection signals to a maximum value of 1. In FIG. 10, the curve denoted by the reference numeral 81 represents the normalized signal of the magnetic sensor according to the practical example. The curve denoted by the reference numeral 82 represents the normalized signal of the magnetic sensor according to the comparative example.

As shown in FIG. 10, the normalized signal of the magnetic sensor (reference numeral 82) according to the comparative example changes linearly within the range where H/Hk is 0 to 0.7. The normalized signal of the magnetic sensor (reference numeral 81) according to the practical example changes linearly within the range where H/Hk is 0 to 0.8. As can be seen from FIG. 10, according to the present example embodiment, the range where the detection signals generated by the magnetic sensor 1 change linearly can be expanded.

As shown in FIG. 8, the end faces of the MR element 230 in the −Y direction and the Y direction of the comparative example are each tilted relative to the XY plane. To reduce the concentration of magnetic charges at the portions of the outer peripheral surface of the free layer 234 near the first and second edges Ed11 and Ed12 in the MR element 230 of the comparative example, the foregoing end faces can be tilted more greatly. However, the effect of increasing the tilt of the end faces as described above is limited since the MR element typically has a small thickness.

Moreover, the MR element 230 of the comparative example causes the following problems if the tilt of the end faces is increased. That is, increasing the tilt of the end faces increases regions not covered with the cap layer when seen in the Z direction, and the MR element 230 can become more prone to corrosion and oxidation. The free layer 234 is sometimes made of a layered film including a plurality of layers.

In such a case, increasing the tilt of the end faces as described above reduces the areas of the layers of the layered film closer to the cap layer, and can change the properties of the free layer 234 at the edges. Moreover, in forming a plurality of MR elements 230, if the tilt of the end faces is increased with the shape of the resist mask unchanged, the width of the tilted part of each of the MR elements 230 is increased. As a result, the distance between the two adjoining MR elements 230 decreases. The distance between the two adjoining MR elements 230 need to be increased to reduce a risk of the two adjoining MR elements 230 being electrically connected. However, an increase in the distance between the two adjoining MR elements 230 lowers the integration density of the plurality of MR elements 230 and results in a decrease in an S/N ratio.

By contrast, in the present example embodiment, the concentration of magnetic charges at the portion of the outer peripheral surface of the free layer 34 near the first edge Ed1 can be reduced without increasing the tilt of the end faces of the MR element 30 in the −Y direction and the Y direction as described above. In other words, according to the present example embodiment, the concentration of magnetic charges can be reduced while preventing the occurrence of the problems due to the increased tilt of the end faces of the MR element 30.

Moreover, in the present example embodiment, the concentration of magnetic charges can easily be reduced by forming the MR element 30 so that at least a part of the MR element 30 is located on the curved portion 60*a*2 of the opposed surface 60*a*.

The present example embodiment has dealt with the case where the MR element 30 is located on the curved portion 60*a*2. However, the MR element 30 may be located on the following inclined portion. The inclined portion includes a plurality of flat surfaces. Of the plurality of flat surfaces, the one closest to the bottom surface 60*b* of the support member 60 will be referred to as a first flat surface. The flat surface farthest from the bottom surface 60*b* of the support member 60 will be referred to as a second flat surface. The MR element 30 is located across the first flat surface and the second flat surface. An angle that the first flat surface forms with the bottom surface 60*b* of the support member 60 is greater than angles that the respective flat surfaces other than the first flat surface form with the bottom surface 60*b* of the support member 60. The angle that the second flat surface forms with the bottom surface 60*b* of the support member 60 is smaller than the angles that the respective flat surfaces other than the second flat surface form with the bottom surface 60*b* of the support member 60.

The present example embodiment has dealt with the case where the entire MR element 30 is located on the first inclined surface SL1 or the second inclined surface SL2 of the curved portion 60*a*2. However, as will be described in a second example embodiment, the MR element 30 may be located across the first inclined surface SL1 and the second inclined surface SL2.

The present example embodiment has also dealt with the case where both the first and second edges Ed1 and Ed2 are located above the first inclined surface SL1 or both the first and second edges Ed1 and Ed2 are located above the second inclined surface SL2. However, if either one of the first and second edges Ed1 and Ed2 is located above the first inclined surface SL1 or the second inclined surface SL2, the other may be located above the flat portion 60*a*1 or above the border between the first and second inclined surfaces SL1 and SL2.

Modification Examples

Figure 11:
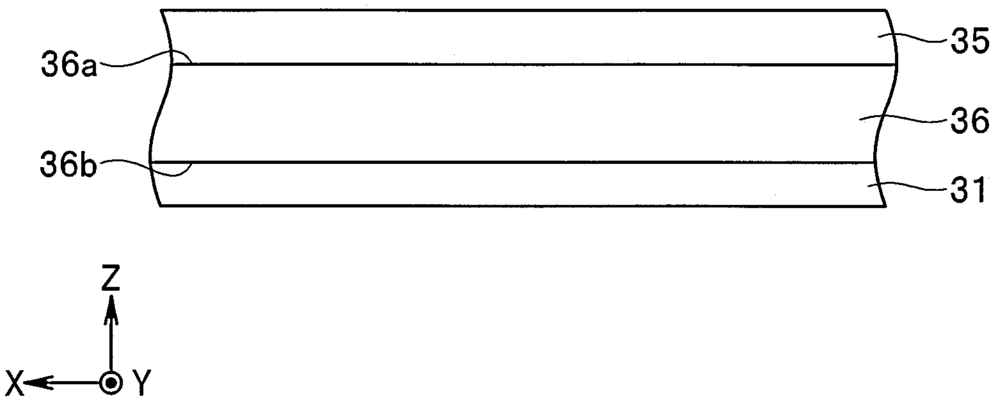
FIG. 11 is a sectional view showing a first modification example of the magnetoresistive element of the first example embodiment of the technology.

Next, modification examples of the present example embodiment will be described. Initially, a first modification example of the MR element 30 will be described with reference to FIG. 11. In the first modification example, the MR element 30 is an anisotropic magnetoresistive (AMR) element. In the first modification example, the MR element 30 includes a magnetic layer 36 given magnetic anisotropy, instead of the magnetization pinned layer 32, the spacer layer 33, and the free layer 34 shown in FIG. 6. The magnetic layer 36 has a magnetization whose direction is variable depending on the direction of the external magnetic field. As described above, the MR element 30 is patterned to a shape that is long in the X direction. This gives the magnetic layer 36 magnetic shape anisotropy where the direction of the easy axis of magnetization is parallel to the X direction.

The magnetic layer 36 has a first surface 36*a* having a shape that is long in the X direction, a second surface 36*b* opposite to the first surface 36*a*, and an outer peripheral surface connecting the first surface 36*a* and the second surface 36*b*. The description of the shape of the MR element 30 with reference to FIGS. 6 and 7 also applies to the first modification example. The description of the shape of the MR element 30 applies to the shape of the first modification example, with the free layer 34, the first surface 34*a*, and the second surface 34*b* in the description replaced with the magnetic layer 36, the first surface 36*a*, and the second surface 36*b*.

Figure 12:
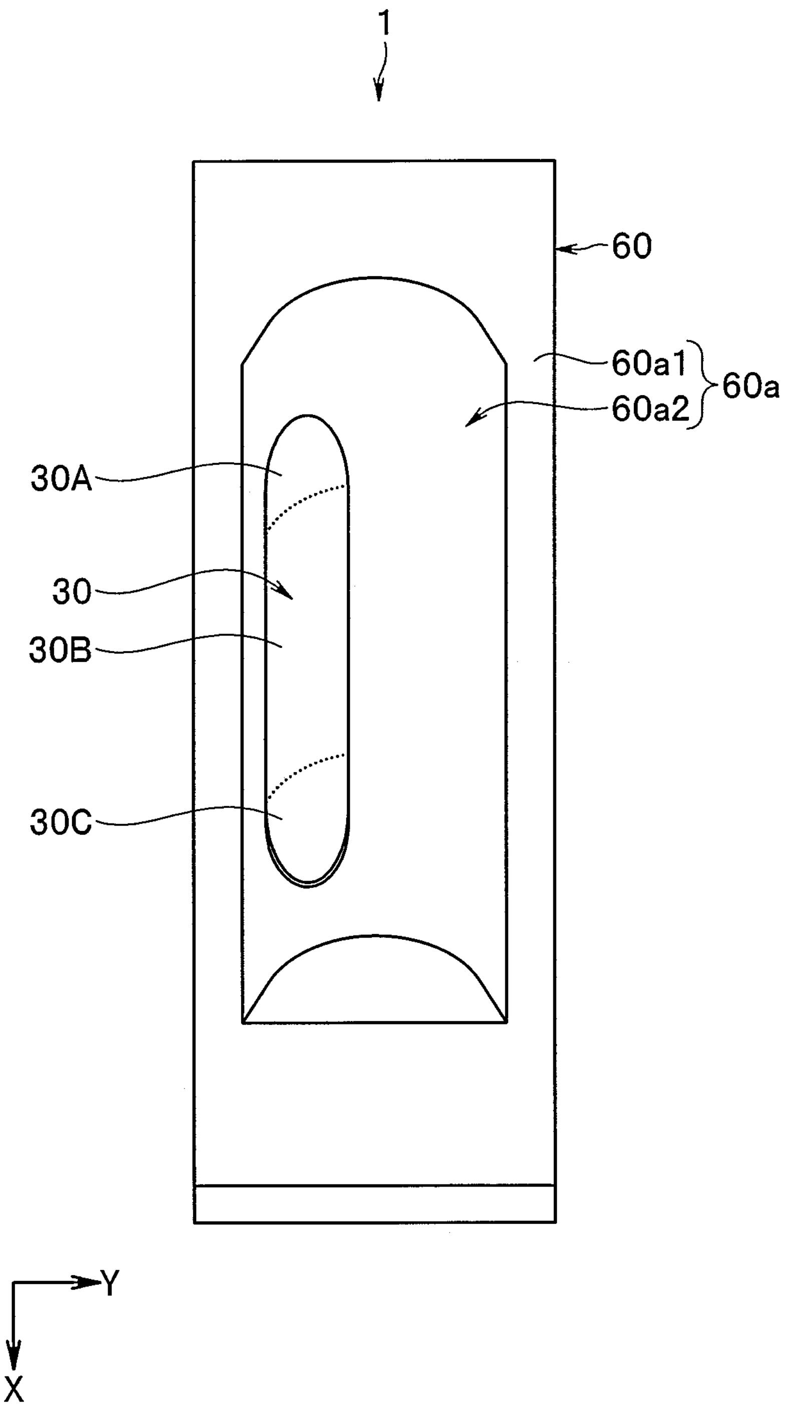
FIG. 12 is an explanatory diagram for describing a second modification example of the magnetoresistive element of the first example embodiment of the technology.

Next, a second modification example of the MR element 30 will be described with reference to FIG. 12. In the second modification example, the MR element 30 has an oval planar shape. The MR element 30 includes a constant width portion 30B, a first width changing portion 30A, and a second width changing portion 30C. The first width changing portion 30A is located in front of the constant width portion 30B in the −X direction. The second width changing portion 30C is located in front of the constant width portion 30B in the X direction. In FIG. 12, the border between the constant width portion 30B and the first width changing portion 30A and the border between the constant width portion 30B and the second width changing portion 30C are shown by dotted lines.

The constant width portion 30B has a constant width (dimension in the direction parallel to the Y direction) regardless of the position in the X direction. The width of the first width changing portion 30A decreases with increasing distance from the constant width portion 30B. The width of the second width changing portion 30C decreases with increasing distance from the constant width portion 30B.

The first and second width changing portions 30A and 30C are provided to control the magnetic domain structure of the free layer 34, for example. In the first and second width changing portions 30A and 30C, a difference between the thickness T2 at the second edge Ed2 and the thickness T1 at the first edge Ed1 decreases with increasing distance from the constant width portion 30B. This lowers the effect of reducing the concentration of magnetic charges at the portion of the MR element 30 near the end in the −X direction and the portion of the MR element 30 near the end in the X direction. However, the difference between the thicknesses T2 and T1 in the portions other than the foregoing is sufficiently large, whereby the effect of reducing the concentration of magnetic charges can be obtained.

Figure 13:
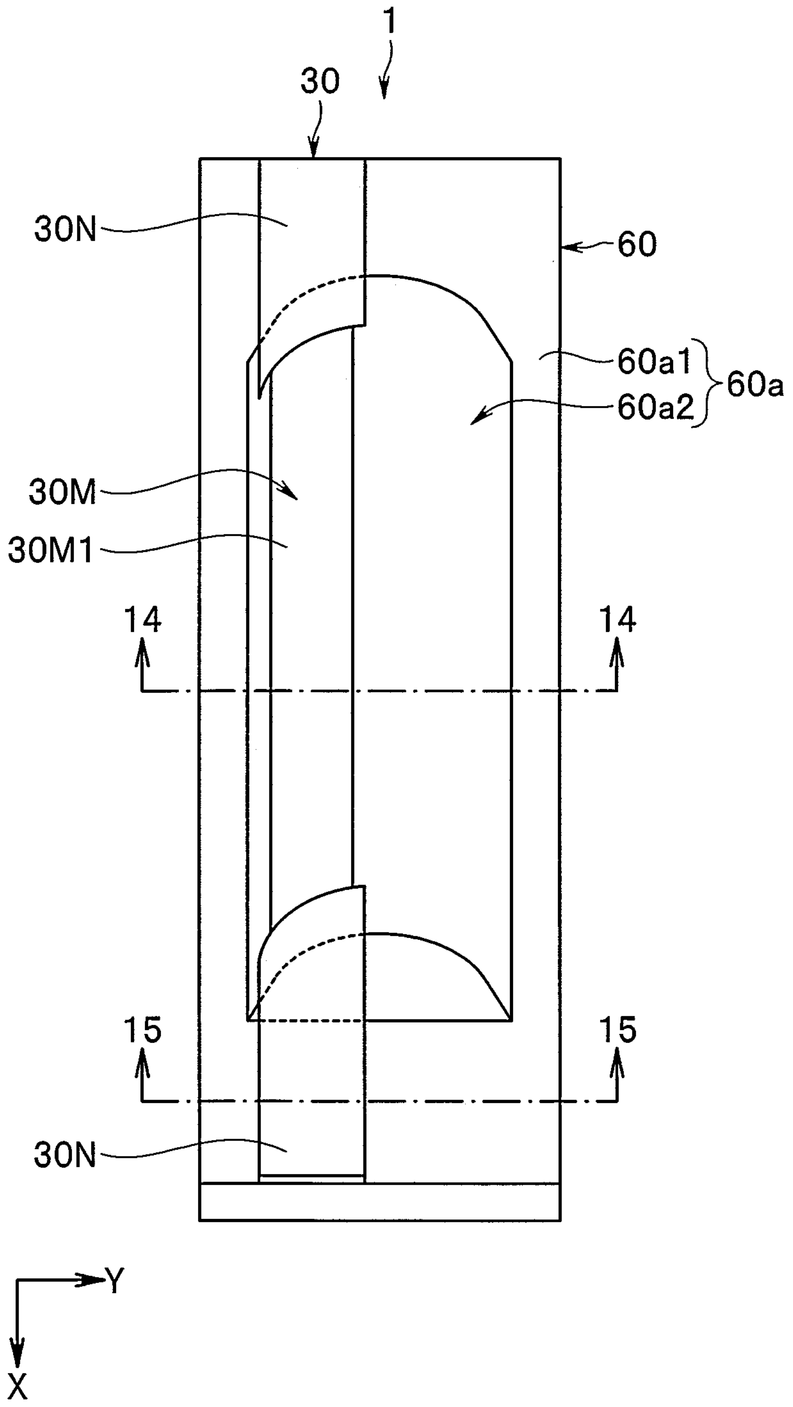
FIG. 13 is an explanatory diagram for describing a third modification example of the magnetoresistive element of the first example embodiment of the technology.
Figure 14:
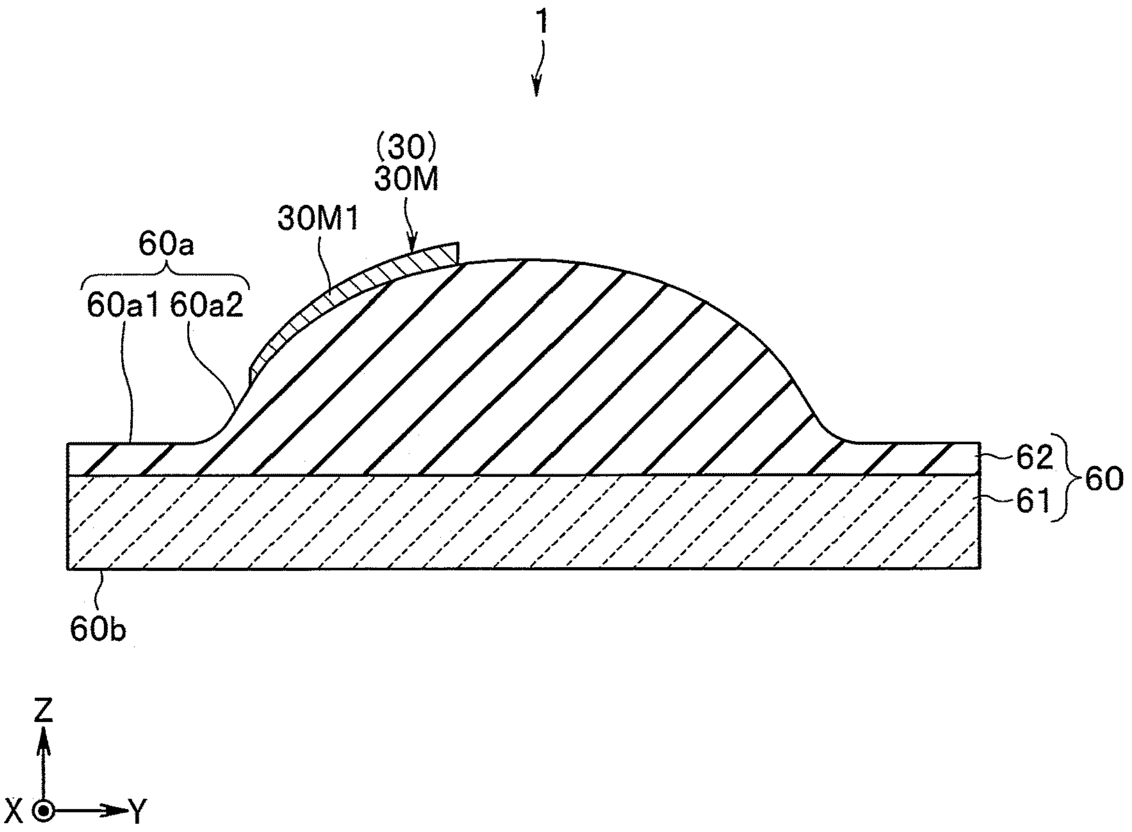
FIG. 14 is a cross-sectional view along line 14-14 of FIG. 13.
Figure 15:
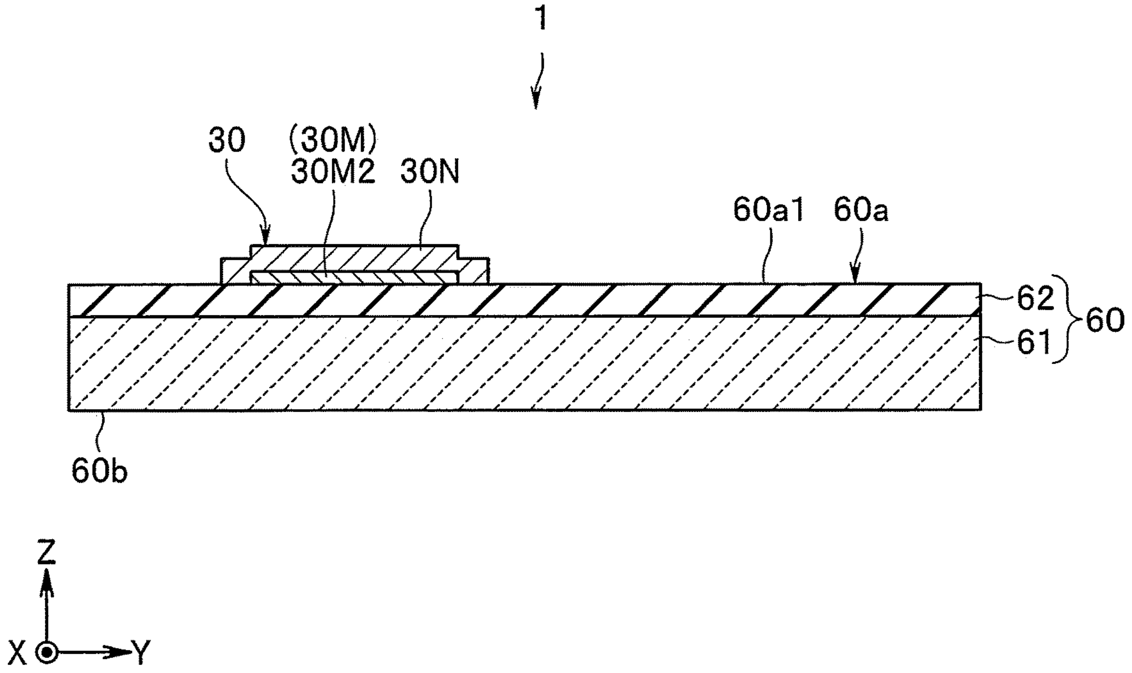
FIG. 15 is a cross-sectional view along line 15-15 of FIG. 13.

Next, a third modification example of the MR element 30 will be described with reference to FIGS. 13 to 15. The MR element 30 shown in FIGS. 13 to 15 is a current in-plane (CIP) MR element. FIG. 13 is an explanatory diagram for describing the third modification example of the MR element 30. FIG. 14 is a cross-sectional view showing a cross section at the position indicated by the line 14-14 of FIG. 13. FIG. 15 is a cross-sectional view showing a cross section at the position indicated by the line 15-15 of FIG. 13. For the sake of convenience, FIGS. 14 and 15 show only the MR element 30 and the support member 60.

The MR element 30 includes a layered film including the underlayer 31, the magnetization pinned layer 32, the spacer layer 33, the free layer 34, and the cap layer 35 (see FIG. 6). This layered film will be denoted by the reference numeral 30M. In the third modification example, the dimension of the layered film 30M in a direction parallel to the X direction is greater than that of the curved portion 60*a*2 of the opposed surface 60*a* of the support member 60 in the direction parallel to the X direction. A part of the layered film 30M is located on the curved portion 60*a*2. Another part of the layered film 30M is located on the flat portion 60*a*1 of the opposed surface 60*a* in front of the curved portion 60*a*2 in the −X direction. Yet another part of the layered film 30M is located on the flat portion 60*a*1 of the opposed surface 60*a* in front of the curved portion 60*a*2 in the X direction. The portion of the layered film 30M located on the curved portion 60*a*2 will hereinafter be referred to as a curved surface-located portion 30M1. The portions of the layered film 30M located on the flat portion 60*a*1 will be referred to as flat surface-located portions 30M2.

In the third modification example, the MR element 30 further includes a nonmagnetic metal film 30N. As shown in FIGS. 13 and 15, the nonmagnetic metal film 30N covers the flat surface-located portions 30M2. As shown in FIGS. 13 and 15, the nonmagnetic metal film 30N does not cover most of the curved surface-located portion 30M1.

The flat surface-located portions 30M2 are substantially the same as the MR element 230 of the comparative example shown in FIG. 8. These portions therefore do not provide the effect of reducing the concentration of magnetic charges. Meanwhile, the curved surface-located portion 30M1 provides the effect of reducing the concentration of magnetic charges. In the third modification example, the flat surface-located portions 30M2 are covered with the nonmagnetic metal film 30N, whereby only a signal corresponding to the resistance of the curved surface-located portion 30M1 can be detected from the MR element 30. In other words, in the third modification example, only the curved surface-located portion 30M1 can substantially function as the MR element 30. The effect of reducing the concentration of magnetic charges can thus be obtained.

In the third modification example, if the flat surface-located portions 30M2 are sufficiently small compared to the curved surface-located portion 30M1, the nonmagnetic metal film 30N may be omitted.

Second Example Embodiment

Figure 16:
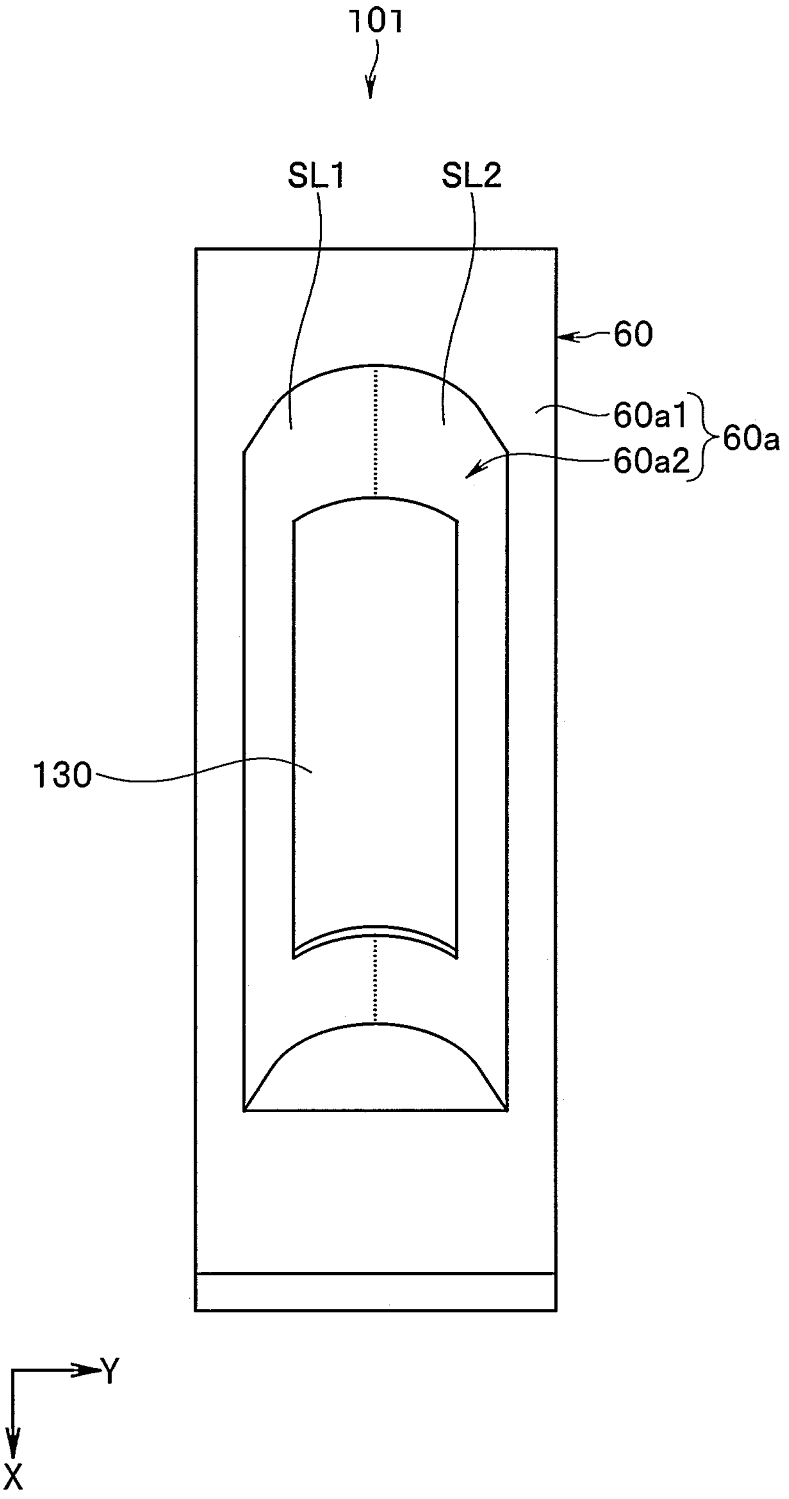
FIG. 16 is a schematic diagram showing a part of a magnetic sensor according to a second example embodiment of the technology.
Figure 17:
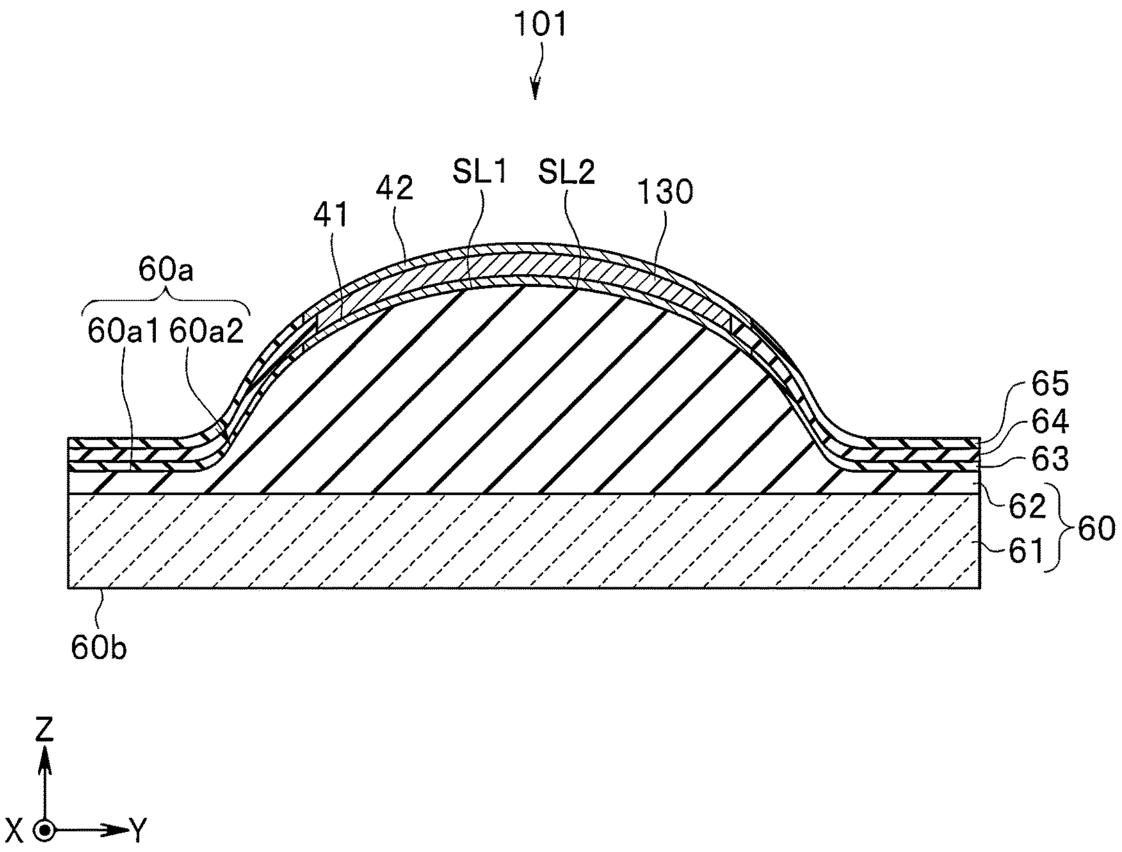
FIG. 17 is a sectional view showing a part of the magnetic sensor according to the second example embodiment of the technology.

A second example embodiment of the invention will now be described. Initially, a configuration of a magnetic sensor according to the present example embodiment will be described with reference to FIGS. 16 and 17. FIG. 16 is a schematic diagram showing a part of the magnetic sensor according to the present example embodiment. FIG. 17 is a cross-sectional view showing a part of the magnetic sensor according to the present example embodiment.

A magnetic sensor 101 according to the present example embodiment has the same configuration as that of the magnetic sensor 1 according to the first example embodiment except for the MR elements. The magnetic sensor 101 according to the present example embodiment includes MR elements 130 instead of the MR elements 30 according to the first example embodiment. FIG. 17 shows a cross section parallel to the YZ plane and intersecting an MR element 130.

The MR element 130 is located on the curved portion 60*a*2 of the opposed surface 60*a* of the support member 60. In particular, in the present example embodiment, the MR element 130 is located across the first inclined surface SL1 and the second inclined surface SL2. The MR element 130 has a shape that is long in the X direction. The MR element 130 has a rectangular planar shape.

The MR element 130 may be a spin-valve MR element or an AMR element. The following description will be given by using the case where the MR element 130 is a spin-valve MR element as an example. Like the MR element 30 shown in FIG. 6 according to the first example embodiment, the MR element 130 includes an underlayer 31, a magnetization pinned layer 32, a spacer layer 33, a free layer 34, and a cap layer 35. For the sake of convenience, in the present example embodiment, the direction of the magnetization of the magnetization pinned layer 32 will be referred to as a Y direction or a −Y direction. The free layer 34 has magnetic shape anisotropy where the direction of the easy axis of magnetization is parallel to the X direction.

Figure 18:
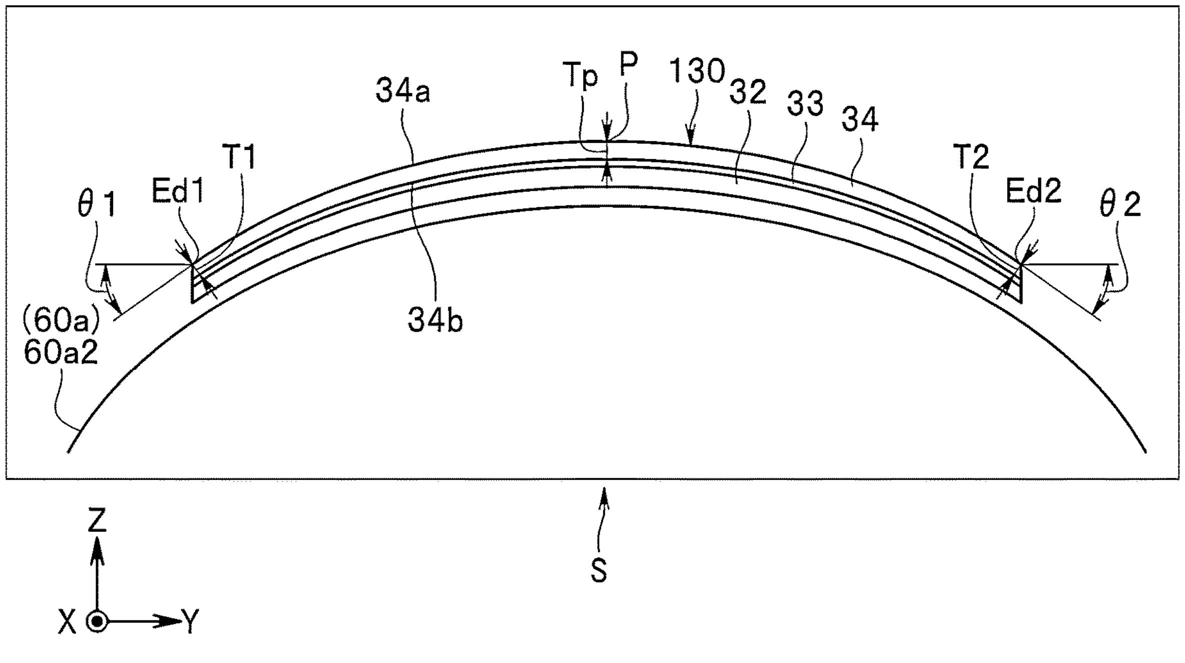
FIG. 18 is an explanatory diagram for describing a shape of a free layer of the second example embodiment of the technology.

Next, the MR element 130 will be described in more detail with reference to FIG. 18. FIG. 18 is an explanatory diagram for describing the shape of the free layer 34. FIG. 18 is an enlarged view of a part of the cross section shown in FIG. 17. In FIG. 18, the underlayer 31 and the cap layer 35 of the MR element 130 are omitted.

As described in the first example embodiment, the free layer 34 has a first surface 34*a*, a second surface 34*b*, and an outer peripheral surface. The first surface 34*a* has a first edge Ed1 and a second edge Ed2 located at both lateral ends of the first surface 34*a*. In the present example embodiment, the first edge Ed1 is located on the first inclined surface SL1 of the curved portion 60*a*2. The second edge Ed2 is located on the second inclined surface SL2 of the curved portion 60*a*2. The distance from the bottom surface 60*b* of the support member 60 to the first edge Ed1 and the distance from the bottom surface 60*b* of the support member 60 to the second edge Ed2 may be the same or different from each other.

In a given cross section S intersecting the free layer 34 and perpendicular to the longitudinal direction of the first surface 34*a* (direction parallel to the X direction), both the inclination angle $\theta 1$ at the first edge Ed1 and the inclination angle $\theta 2$ at the second edge Ed2 are greater than the inclination angle $\theta p$ at a predetermined point P. In the present example embodiment, the predetermined point P refers to a point on the first surface 34*a* where the inclination angle $\theta$ is the smallest. In particular, in the present example embodiment, the inclination angle $\theta$ at the predetermined point P is $\theta$. In the given cross section S, the inclination angle $\theta$ increases toward the first edge Ed1 from the predetermined point P and increases toward the second edge Ed2 from the predetermined point P.

In the given cross section S, both the thickness T1 at the first edge Ed1 and the thickness T2 at the second edge Ed2 are smaller than the thickness Tp at the predetermined point P. In the given cross section S, the thickness T decreases toward the first edge Ed1 from the predetermined point P and decreases toward the second edge Ed2 from the predetermined point P.

As in the first example embodiment, an angle that the opposed surface 60*a* forms with the reference plane (bottom surface 60*b* of the support member 60) in a given cross section S will be denoted by the symbol ϕ. In the present example embodiment, the angle ϕ at the position on the opposed surface 60*a* closest to the second edge Ed2 is greater than the angle ϕ at the position on the opposed surface 60*a* closest to the predetermined point P. The angle ϕ increases toward the position on the opposed surface 60*a* closest to the first edge Ed1 from the position on the opposed surface 60*a* closest to the predetermined point P and increases toward the position on the opposed surface 60*a* closest to the second edge Ed2 from the position on the opposed surface 60*a* closest to the predetermined point P.

In the present example embodiment, the thickness T2 at the second edge Ed2 is smaller than that in the first example embodiment where the second edge Ed2 is located near the top of the curved portion 60*a*2. According to the present example embodiment, the concentration of magnetic charges at the portion of the outer peripheral surface of the free layer 34 near the second edge Ed2 can thereby be reduced. According to the present example embodiment, the magnetization of the free layer 34 can thus be more effectively prevented from changing nonlinearly with respect to a change in the strength of the external magnetic field. As a result, according to the present example embodiment, the range where the detection signals generated by the magnetic sensor 101 change linearly can be expanded.

The configuration, operation and effects of the present example embodiment are otherwise the same as those of the first example embodiment.

Third Example Embodiment

Figure 19:
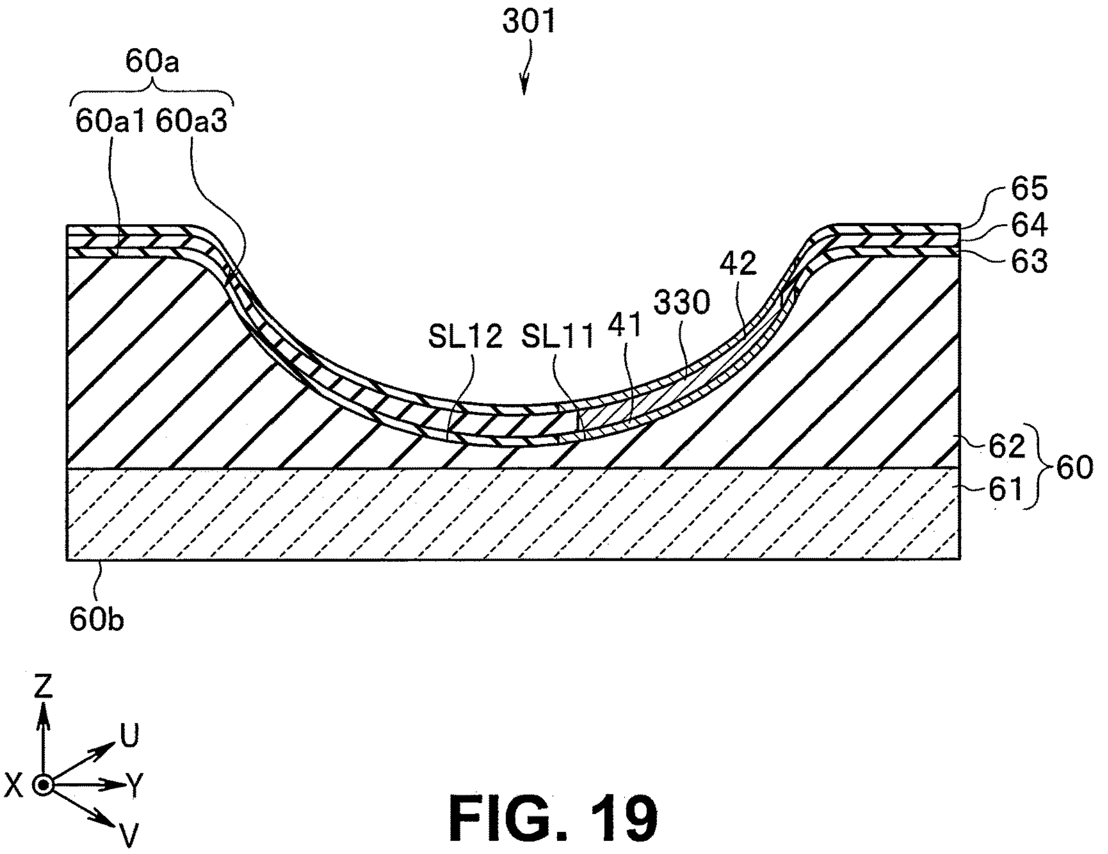
FIG. 19 is a sectional view showing a cross section of a magnetic sensor according to a third example embodiment of the technology.

A third example embodiment of the invention will now be described. Initially, a configuration of a magnetic sensor according to the present example embodiment will be described with reference to FIG. 19. FIG. 19 is a cross-sectional view showing a part of the magnetic sensor according to the present example embodiment.

A configuration of the magnetic sensor 301 according to the present example embodiment differs from that of the magnetic sensor 1 according to the first example embodiment in the following respect. The magnetic sensor 301 according to the present example embodiment includes MR elements 330 instead of the MR elements 30 according to the first example embodiment. FIG. 19 shows a cross section parallel to the YZ plane and intersecting an MR element 330.

The opposed surface 60*a* of the support member 60 includes at least one curved portion 60*a*3 not parallel to the bottom surface 60*b* of the support member 60, instead of the curved portion 60*a*2 according to the first example embodiment. As shown in FIG. 19, the curved portion 60*a*3 is a concave surface recessed toward the bottom surface 60*b*. The curved portion 60*a*3 has a curved shape (arch shape) curved to be recessed toward the bottom surface 60*b* (−Z direction) in a given cross section parallel to the YZ plane. In the given cross section parallel to the YZ plane, the distance from the bottom surface 60*b* to the curved portion 60*a*3 is the smallest at the center of the curved portion 60*a*3 in a direction parallel to the Y direction (hereinafter, referred to simply as the center of the curved portion 60*a*3).

The at least one curved portion 60*a*3 extends along the X direction. The overall shape of the at least one curved portion 60*a*3 is a semicylindrical surface formed by moving the curved shape shown in FIG. 19 along the X direction. The insulating layer 62 of the support member 60 has a cross-sectional shape such that the curved portion 60*a*3 is formed in the opposed surface 60*a*. Specifically, the insulating layer 62 has a cross-sectional shape recessed in the −Z direction in a given cross section parallel to the YZ plane.

A portion of the curved portion 60*a*3 from an edge at the end of the curved portion 60*a*3 in the Y direction to the center of the curved portion 60*a*3 will be referred to as a first inclined surface and be denoted by the reference symbol SL11. A portion of the curved portion 60*a*3 from an edge at the end of the curved portion 60*a*3 in the −Y direction to the center of the curved portion 60*a*3 will be referred to as a second inclined surface and be denoted by the reference symbol SL12. Both the first and second inclined surfaces SL11 and SL12 are inclined relative to the reference plane, i.e., the bottom surface 60*b*. In the present example embodiment, the entire MR element 330 is located on the first inclined surface SL11 or the second inclined surface SL12. FIG. 19 shows how the MR element 30 is located on the first inclined surface SL11.

The MR element 330 has a shape that is long in the X direction. The MR element 330 has a rectangular planar shape.

The MR element 330 may be a spin-valve MR element or an AMR element. The following description will be given by using the case where the MR element 330 is a spin-valve MR element as an example. Like the MR element 30 shown in FIG. 6 according to the first example embodiment, the MR element 330 includes an underlayer 31, a magnetization pinned layer 32, a spacer layer 33, a free layer 34, and a cap layer 35. The free layer 34 has magnetic shape anisotropy where the direction of the easy axis of magnetization is parallel to the X direction.

Figure 20:
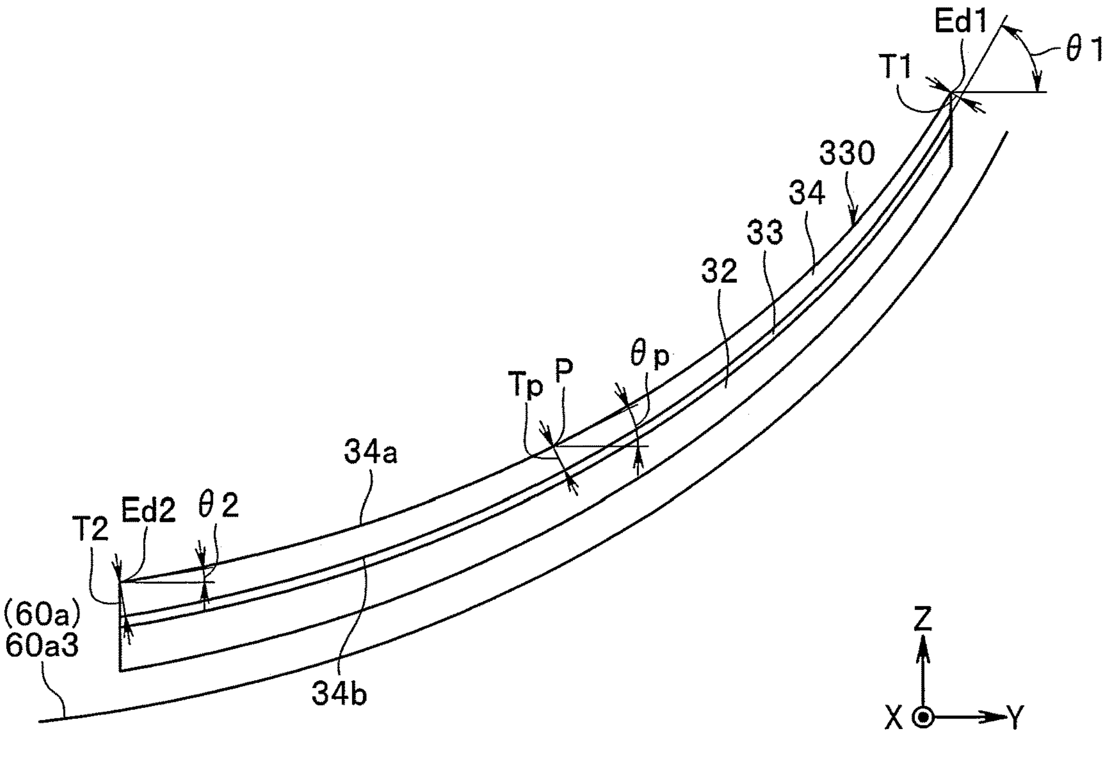
FIG. 20 is an explanatory diagram for describing a shape of a free layer of the third example embodiment of the technology.

Next, the MR element 330 will be described in more detail with reference to FIG. 20. FIG. 20 is an explanatory diagram for describing the shape of the free layer 34. FIG. 20 is an enlarged view of a part of the cross section shown in FIG. 19. In FIG. 20, the underlayer 31 and the cap layer 35 of the MR element 330 are omitted.

As described in the first example embodiment, the free layer 34 has a first surface 34*a*, a second surface 34*b*, and an outer peripheral surface. The first surface 34*a* has a first edge Ed1 and a second edge Ed2 located at both lateral ends of the first surface 34*a*. In the present example embodiment, both the first and second edges Ed1 and Ed2 are located above the first inclined surface SL11 of the curved portion 60*a*3 or both the first and second edges Ed1 and Ed2 are located above the second inclined surface SL12 of the curved portion 60*a*3. The distance from the bottom surface 60*b* of the support member 60 to the first edge Ed1 is greater than the distance from the bottom surface 60*b* of the support member 60 to the second edge Ed2.

The relationship between the inclination angle θ1 at the first edge Ed1, the inclination angle θ2 at the second edge Ed2, and the inclination angle θp at the predetermined point P in a given cross section S intersecting the free layer 34 and perpendicular to the longitudinal direction of the first surface 34*a* (direction parallel to the X direction) is the same as that in the first example embodiment. The relationship between the thickness T1 at the first edge Ed1, the thickness T2 at the second edge Ed2, and the thickness Tp at the predetermined point P in the given cross section S is also the same as that in the first example embodiment. For the sake of convenience, an imaginary surface is assumed by extending the second surface 34*b* along the curved portion 60*a*3, and the thickness T1 is defined as the distance between the first surface 34*a* and the imaginary surface in the direction perpendicular to the first surface 34*a*.

Like the MR element 130 according to the second example embodiment, the MR element 330 may be located across the first inclined surface SL11 and the second inclined surface SL12. The configuration, operation and effects of the present example embodiment are otherwise the same as those of the first or second example embodiment.

The technology is not limited to the foregoing example embodiments, and various modifications may be made thereto. For example, the number and arrangement of MR elements and the number and arrangement of curved portions are not limited to those described in the example embodiments, and may be freely chosen as long as the requirements set forth in the claims are satisfied.

The MR elements according to the technology may be located on a flat surface parallel to the reference plane as long as the requirement that the thickness T1 at the first edge Ed1 be smaller than the thickness Tp at a predetermined point P in a given cross section S is satisfied. The MR element including the free layer 34 having such a thickness T can be implemented, for example, by so-called wedge deposition capable of forming an inclined film thickness.

Obviously, various modification examples and variations of the technology are possible in the light of the above teachings. Thus, it is to be understood that, within the scope of the appended claims and equivalents thereof, the technology may be practiced in other embodiments than the foregoing most example embodiments.

What is claimed is:

1. A magnetic sensor comprising a magnetoresistive element and a support member that supports the magnetoresistive element, wherein:

the magnetoresistive element includes a magnetic layer having a magnetization whose direction is variable;

the magnetic layer has a first surface and a second surface located opposite the first surface;

the first surface has a first edge and a second edge located at both ends in a first direction;

the support member has an opposed surface opposed to the magnetoresistive element;

at least a part of the opposed surface is inclined relative to a reference plane; and an angle that the opposed surface forms with the reference plane in a given cross section intersecting the magnetic layer and perpendicular to a second direction intersecting the first surface direction is greater at a first position that is a position on the opposed surface closest to the first edge than at a position on the opposed surface closest to a predetermined point on the first surface between the first edge and the second edge.

2. The magnetic sensor according to claim 1, wherein the angle at a second position that is a position on the opposed surface closest to the second edge is smaller than the angle at the position on the opposed surface closest to the predetermined point.

3. The magnetic sensor according to claim 2, wherein the angle increases toward the first position from the second position.

4. The magnetic sensor according to claim 1, wherein the angle at a second position that is a position on the opposed surface closest to the second edge is greater than the angle at the position on the opposed surface closest to the predetermined point.

5. The magnetic sensor according to claim 4, wherein the angle increases toward the first position from the position on the opposed surface closest to the predetermined point and increases toward the second position from the position on the opposed surface closest to the predetermined point.

6. The magnetic sensor according to claim 1, wherein:

the magnetic layer has a thickness that is a dimension in a direction perpendicular to the opposed surface; and the thickness at a given position on the first surface decreases as the angle at a position on the opposed surface closest to the given position increases.

7. The magnetic sensor according to claim 1, wherein:

the opposed surface includes a curved portion not parallel to the reference plane; and at least a part of the magnetoresistive element is located on the curved portion.

8. The magnetic sensor according to claim 7, wherein at least either one of the first edge and the second edge is located above the curved portion.

9. The magnetic sensor according to claim 7, wherein the curved portion is a convex surface.

10. The magnetic sensor according to claim 7, wherein the curved portion is a concave surface.

11. A magnetic sensor comprising a magnetoresistive element whose resistance changes with an external magnetic field, and configured to generate a detection signal corresponding to the resistance, wherein:

the magnetoresistive element includes a magnetic layer having a magnetization whose direction is variable;

the magnetic layer has a shape that is long in one direction; and the detection signal changes linearly within a range where a ratio of a strength of the external magnetic field to a strength of a magnetic anisotropy field of the magnetic layer is 0 to 0.8.

12. The magnetic sensor according to claim 11, wherein:

the magnetic layer has a first surface and a second surface located opposite the first surface, and has a thickness that is a dimension in a direction perpendicular to the first surface of the magnetic layer;

the first surface has a first edge and a second edge located at both lateral ends of the magnetic layer, and in a given cross section intersecting the magnetic layer and perpendicular to a longitudinal direction of the magnetic layer, the thickness at the first edge is smaller than the thickness at a predetermined point on the first surface between the first edge and the second edge.

13. The magnetic sensor according to claim 11, wherein:

the magnetic layer has a first surface and a second surface located opposite the first surface;

the first surface has a first edge and a second edge located at both lateral ends of the magnetic layer;

at least a part of the first surface is inclined relative to a reference plane so that an inclination angle is greater than 0, the inclination angle being an angle that the first surface forms with the reference plane; and in a given cross section intersecting the magnetic layer and perpendicular to a longitudinal direction of the magnetic layer, the inclination angle at the first edge is greater than the inclination angle at a predetermined point on the first surface between the first edge and the second edge.

14. The magnetic sensor according to claim 11, further comprising a support member that supports the magnetoresistive element, wherein:

the support member has an opposed surface opposed to the magnetoresistive element;

at least a part of the opposed surface is inclined relative to a reference plane;

the magnetic layer has a first surface and a second surface located opposite the first surface;

the first surface has a first edge and a second edge located at both lateral ends of the magnetic layer; and an angle that the opposed surface forms with the reference plane in a given cross section intersecting the magnetic layer and perpendicular to a longitudinal direction of the magnetic layer is greater at a first position that is a position on the opposed surface closest to the first edge than at a position on the opposed surface closest to a predetermined point on the first surface between the first edge and the second edge.

15. The magnetic sensor according to claim 11, further comprising a support member that supports the magnetoresistive element, wherein:

the support member has an opposed surface opposed to the magnetoresistive element;

the opposed surface includes a curved portion not parallel to a reference plane; and the curved portion is a convex surface.

16. The magnetic sensor according to claim 11, further comprising a support member that supports the magnetoresistive element, wherein:

the support member has an opposed surface opposed to the magnetoresistive element;

the opposed surface includes a curved portion not parallel to a reference plane; and the curved portion is a concave surface.

17. A magnetic sensor comprising a magnetoresistive element and an electrode made of a conductive material, wherein:

the magnetoresistive element includes a magnetic layer having a magnetization whose direction is variable;

the electrode has a top surface opposed to the magnetoresistive element, and has a thickness that is a dimension in a direction perpendicular to the top surface;

the top surface has a first edge and a second edge located at both ends in a first direction; and in a given cross section intersecting the electrode and perpendicular to a second direction that intersects the first direction, the thickness at the first edge is smaller than the thickness at a predetermined point on the top surface between the first edge and the second edge.

18. The magnetic sensor according to claim 17, wherein in the given cross section, the thickness at the second edge is greater than the thickness at the predetermined point.

19. The magnetic sensor according to claim 18, wherein in the given cross section, the thickness decreases toward the first edge from the second edge.

20. The magnetic sensor according to claim 17, wherein in the given cross section, the thickness at the second edge is smaller than the thickness at the predetermined point.

21. The magnetic sensor according to claim 20, wherein in the given cross section, the thickness decreases toward the first edge from the predetermined point and decreases toward the second edge from the predetermined point.

22. The magnetic sensor according to claim 17, further comprising a support member that supports the magnetoresistive element and the electrode, wherein:

the support member has an opposed surface opposed to the electrode;

at least a part of the opposed surface is inclined relative to a reference plane; and the thickness at a given position on the top surface of the electrode decreases as an angle that the opposed surface forms with the reference plane at a position on the opposed surface closest to the given position increases.

23. The magnetic sensor according to claim 22, wherein:

the opposed surface includes a curved portion not parallel to the reference plane; and at least a part of the electrode is located on the curved portion.

24. The magnetic sensor according to claim 23, wherein at least either one of the first edge and the second edge is located above the curved portion.

25. The magnetic sensor according to claim 23, wherein the curved portion is a convex surface.

26. The magnetic sensor according to claim 23, wherein the curved portion is a concave surface.

* * * * *